(12) United States Patent
Gregorich et al.

(10) Patent No.: US 8,957,518 B2
(45) Date of Patent: Feb. 17, 2015

(54) MOLDED INTERPOSER PACKAGE AND METHOD FOR FABRICATING THE SAME

(75) Inventors: Thomas Matthew Gregorich, San Diego, CA (US); Andrew C. Chang, Hsinchu (TW); Tzu-Hung Lin, Zhubei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/616,890

(22) Filed: Sep. 14, 2012

(65) Prior Publication Data

US 2013/0168857 A1 Jul. 4, 2013

Related U.S. Application Data

(60) Provisional application No. 61/583,113, filed on Jan. 4, 2012, provisional application No. 61/588,347, filed on Jan. 19, 2012.

(51) Int. Cl.
*H01L 23/48* (2006.01)
*H01L 21/00* (2006.01)
*H01L 23/495* (2006.01)

(52) U.S. Cl.
USPC ............ 257/738; 438/121; 438/124; 257/676

(58) Field of Classification Search
CPC ............ H01L 23/49827; H01L 25/105; H01L 25/0655; H01L 21/56; H01L 25/0657; H01L 2225/06558; H01L 2225/1058; H01L 2225/1041; H01L 2225/1023; H01L 2225/06517; H01L 2225/0651; H01L 2224/81203; H01L 2224/81192; H01L 2224/16225

USPC .................. 257/738, 312, 316, 324, E21.502, 257/E21.506; 438/121, 124

See application file for complete search history.

(56) References Cited

U.S. PATENT DOCUMENTS

| | | | | |
|---|---|---|---|---|
| 6,064,114 | A * | 5/2000 | Higgins, III ................. | 257/698 |
| 6,103,554 | A * | 8/2000 | Son et al. ..................... | 438/126 |
| 2004/0101993 | A1* | 5/2004 | Salmon ........................ | 438/107 |
| 2006/0079009 | A1* | 4/2006 | Salmon et al. ................ | 438/14 |
| 2008/0026557 | A1* | 1/2008 | Salmon ........................ | 438/612 |
| 2010/0025833 | A1* | 2/2010 | Pagaila et al. ................ | 257/686 |
| 2011/0155433 | A1* | 6/2011 | Funaya et al. ................ | 174/258 |
| 2011/0221054 | A1 | 9/2011 | Lin et al. | |
| 2011/0278741 | A1* | 11/2011 | Chua et al. ................... | 257/777 |
| 2012/0267751 | A1* | 10/2012 | Haba et al. ................... | 257/499 |

FOREIGN PATENT DOCUMENTS

TW  201145456  12/2011

OTHER PUBLICATIONS

English language machine translation of TW 201145456 (published Dec. 16, 2011).

* cited by examiner

*Primary Examiner* — Long K Tran
*Assistant Examiner* — Dzung Tran
(74) *Attorney, Agent, or Firm* — McClure, Qualey & Rodack, LLP

(57) ABSTRACT

The invention provides a molded interposer package and a method for fabricating the same. The molded interposer package includes a plurality of metal studs. A molding material encapsulates the metal studs leaving the bottom surfaces of the metal studs exposed. A first chip is disposed on the molding material, connecting to the top surfaces of the metal studs. A plurality of solder balls connects and contacts to the bottom surfaces of the metal studs.

25 Claims, 20 Drawing Sheets

MOLDED INTERPOSER PACKAGE AND METHOD FOR FABRICATING THE SAME

CROSS REFERENCE TO RELATED APPLICATIONS

This application claims the benefit of U.S. Provisional Application No. 61/583,113 filed Jan. 4, 2012 and U.S. Provisional Application No. 61/588,347 filed Jan. 19, 2012, the entirety of which is incorporated by reference herein.

BACKGROUND OF THE INVENTION

1. Field of the Invention

The present invention relates to an interposer package and a method for fabricating the same, and in particular, to a molded interposer package and a method for fabricating the same.

2. Description of the Related Art

An interposer is an electrical interface routing between sockets or connecting one socket to another socket. The purpose of an interposer is to widen the pitch of a connection from a bump pitch of a chip or to reroute a connection. The conventional interposer formation, starts with a resin-based core substrate formed by laminated bismaleimide triazine (BT). Next, a through via etching process, insulation oxidation process, metal filling process, multilayer wiring process, solder mask process, micro bumping process, chip mounting process and mold cap process are performed in sequence. It is noted that the conventional core substrate and the through vias are composite structures. The conventional multilayer wiring process and the solder mask process are required to fabricate interconnect structures and solder masks on both sides of the core substrate. The conventional mold cap process is needed for package rigidity. Therefore, the conventional interposer has a high fabrication cost due to the aforementioned complicated process steps. Also, the conventional resin-based core substrate only can be fabricated in a small size because of its poor mechanical strength. The aforementioned disadvantages limit the development of interposer technology. Further, the conventional interposer suffers various design challenges. For example, it is difficult for the conventional interposer to provide a suitable power delivery network for both the core substrate and I/Os, including options for wider power traces, dedicated power planes, dedicated power islands and on-board decoupling capacitors. Also, it is difficult for the conventional interposer to provide configuration options for side-by-side, package-on-package and side-by-POP DRAM memory bus, increase thermal conductivity through the substrate and solder balls, provide of an option for a clip-on heat spreader, maintain current customer printed circuit board (PCB) circuit density limitations, and provide configuration options for multi-die and hybrid wire bonding.

Thus, a novel interposer package structure is desirable.

BRIEF SUMMARY OF INVENTION

A molded interposer package and a method for fabricating the same are provided. An exemplary embodiment of a molded interposer package comprises a plurality of metal studs. A molding material encapsulates the metal studs leaving the bottom surfaces of the metal studs exposed. A first chip is disposed on the molding material, connecting to the top surfaces of the metal studs. A plurality of solder balls connects and contacts to the bottom surfaces of the metal studs.

An exemplary embodiment of a method for fabricating a molded interposer package comprises providing a metal sheet having a top surface and a bottom surface. A first anisotropic etching process is performed to remove a portion of the metal sheet from the top surface of the metal sheet, thereby forming a plurality of first recesses in the metal sheet. A carrier is mounted on the top surface of the metal sheet, covering the first recesses. A second anisotropic etching process is performed to remove a portion of the metal sheet under the first recesses from the bottom surface of the metal sheet, thereby forming a plurality of second recesses in the metal sheet, wherein the first recesses and the second recesses communicate with each other, respectively. A molding material fills the first recesses and the second recesses from the bottom surface of the metal sheet, leaving the bottom surface of the metal sheet exposed. The carrier is removed. A passivation layer is formed on the top surface of the metal sheet, having a plurality of openings therethrough. A plurality of first metal vias is formed through the opening. A solder mask layer is formed on the passivation layer, leaving the first metal vias exposed.

Another exemplary embodiment of a method for fabricating a molded interposer package comprises providing a metal sheet having a top surface and a bottom surface. A first anisotropic etching process is performed to remove a portion of the metal sheet from the top surface of the metal sheet, thereby forming a plurality of first recesses in the metal sheet. A molding material is formed covering the top surface of the metal sheet, filling the first recesses. A plurality of first via openings is formed in the molding material, wherein the first via openings expose the top surface of the metal sheet. A plurality of first metal vias is formed in the first via openings and a plurality of first redistribution layer patterns respectively on the first metal vias. A second anisotropic etching process is performed to remove a portion of the metal sheet from the bottom surface of the metal sheet until a bottom of the molding material is exposed. A solder mask layer is formed on the molding material, leaving the first redistribution layer patterns exposed.

Yet another exemplary embodiment of a method for fabricating a molded interposer package comprises providing a metal sheet having a top surface and a bottom surface. A carrier is mounted on the bottom surface of the metal sheet. An anisotropic etching process is performed to remove a portion of the metal sheet from the top surface of the metal sheet until the carrier is exposed, thereby forming a plurality of vias through the metal sheet. A molding material fills into the vias, leaving the top surface of the metal sheet exposed. The carrier is removed. A passivation layer is formed on the top surface of the metal sheet, having a plurality of openings therethrough. A plurality of first metal vias is formed through the opening. A solder mask layer is formed on the passivation layer, leaving the first metal vias exposed.

Still yet another exemplary embodiment of a method for fabricating a molded interposer package comprises providing a mold chase. A plurality of the metal lumps is loaded in the mold chase, wherein upper portions and lower portions of the metal balls are embedded in the mold chase. A molding material is filled into the mold chase to encapsulate the metal lumps. The mold chase is taken off, leaving the upper portions and the lower portions of the metal lumps exposed. The exposed upper portions and the lower portions of the metal lumps are removed over a top surface and a bottom surface of the molding material. A passivation layer is formed on the top surface of the molding material, having a plurality of openings therethrough. A plurality of first metal vias is formed through the opening. A solder mask layer is formed on the passivation layer, leaving the first metal vias exposed A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
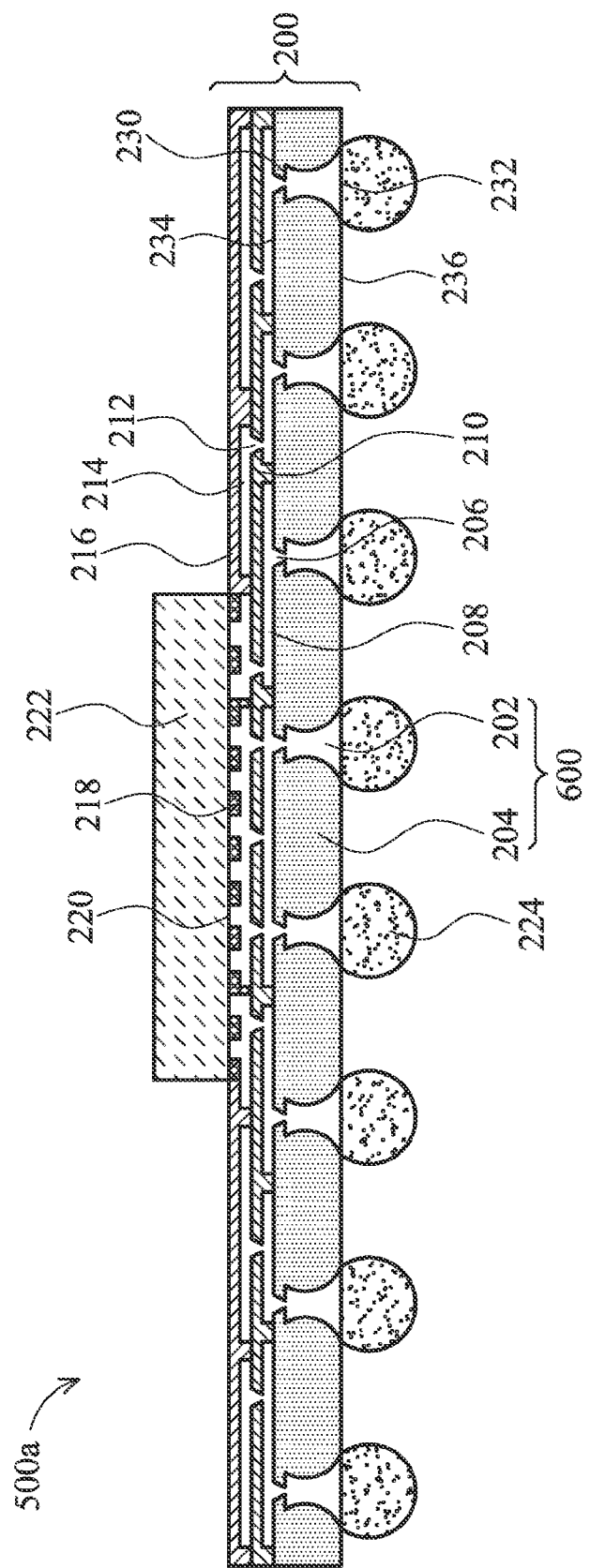
FIG. 1 is a cross section of one exemplary embodiment of a molded interposer package of the invention.

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIG. 1 is a cross section of one exemplary embodiment of a molded interposer package 500a of the invention. As shown in FIG. 1, one exemplary embodiment of a molded interposer package 500a comprises a molded builder interposer (MBI) 200. The MBI 200 comprises a substrate 600. The substrate 600 comprises a plurality of the metal studs 202 and a molding material 204 encapsulates the metal studs 202. The metal studs 202 are isolated from each other. In one embodiment, each of the metal studs 202 has an all-in-one structure, arranged as an array. Also, the metal studs 202 may be formed of copper (Cu). The molding material 204 encapsulates the metal studs 202 leaving the bottom surfaces 232 of the metal studs 202 exposed. In one embodiment, the molding material 204 may be formed of molding materials such as resin. Also, the molding material 204 has an all-in-one structure. In one embodiment, the top surfaces 230 of the metal studs 202 may serve as interconnect pads, which are used to connect to a least one chip (e.g. a chip 222 as shown in FIG. 1), of the MBI 200, and the bottom surfaces 232 of the metal studs 202 may serve as ball pads, which are used to connect to pads of a printed circuit board (PCB) (not shown). Accordingly, a top surface 234 of the substrate 600 may serve as a chip-side surface of the MBI 200, and a bottom surface 236 of the substrate 600 may serve as a PCB-side surface. In one embodiment, the top surfaces 230 of the metal studs 202 may be lower or coplanar with the top surface of the molding material 204, and the bottom surfaces 232 of the metal studs 202 are above or coplanar with the bottom surface of the molding material 204.

In one embodiment, redistribution layer (RDL) patterns, dielectric layers and metal vias disposed on chip-side surface of the substrate 600 may collectively serve as an interconnect structure of the MBI 200, and the of the interconnect structure is used for electrical connection between the MBI 200 and the chip 222 disposed thereon. As shown in FIG. 1, a plurality of first metal vias 206 through a portion of the molding material 204 is directly above the metal studs 202. Alternatively, the first metal vias 206 may be formed through a passivation layer (not shown) covering the top surface 234 of the substrate 600. A first redistribution layer pattern 208 is disposed on the first metal vias 206. As shown in FIG. 1, the first metal vias 206 connect to both the top surfaces 230 of the metal studs 202 and the first redistribution layer pattern 208. Also, a dielectric layer 210, which also serves as an RDL dielectric layer, covers the first redistribution layer pattern 208. Alternatively, the interconnect structure may comprise signal-level or multi-level redistribution layer patterns. In one embodiment as shown in FIG. 1, the interconnect structure comprises a plurality of second metal vias 212 through the dielectric layer 210 and a second redistribution layer pattern 214 covers and connects to the second metal vias 212. A solder mask layer 216 is disposed on top of the interconnect structure, such as on the second redistribution layer pattern 214. In one embodiment, the solder mask layer 216 is the topmost layer of the MBI 200. A chip 222 is disposed on the chip side surface (i.e. the top surface 234) of the substrate 600, contacting a top surface of the solder mask layer 216. As shown in FIG. 1, the chip 222 has a plurality of conductive bumps 220 through the solder mask 216 to connect to the interconnect structure. Specifically, the conductive bumps 220 of the chip 222 may directly connect to the topmost redistribution layer patterns, for example, the second redistribution layer pattern 214 in this embodiment. Therefore, the chip 222 connects to the top surfaces 230 of the metal studs 202 through the conductive bumps 220 and the interconnect structure. In one embodiment, the conductive bumps 220 comprise solder balls, metal pillars or combinations thereof. Further, an underfill material 218 is disposed between the solder mask layer 216 and the chip 222. In one embodiment, it is noted that the molded interposer packages 500a already has used a molding material encapsulating the metal studs 202 (i.e. the molding material 204) for package rigidity. Therefore, no molding material is needed to cover the chip 222 and the solder mask layer 216.

In one embodiment, a plurality of solder balls 224 is disposed on the PCB-side surface (i.e. the bottom surface 236) of the substrate 600 for electrical connections between the MBI 200 and a PCB (not shown). As shown in FIG. 1, the solder balls 224 connect and contact to the bottom surfaces 232 of the metal studs 202, respectively. It is noted that a bottom surface 236 of the substrate 600 is not covered by any solder mask layer or any redistribution layer.

Figure 2:
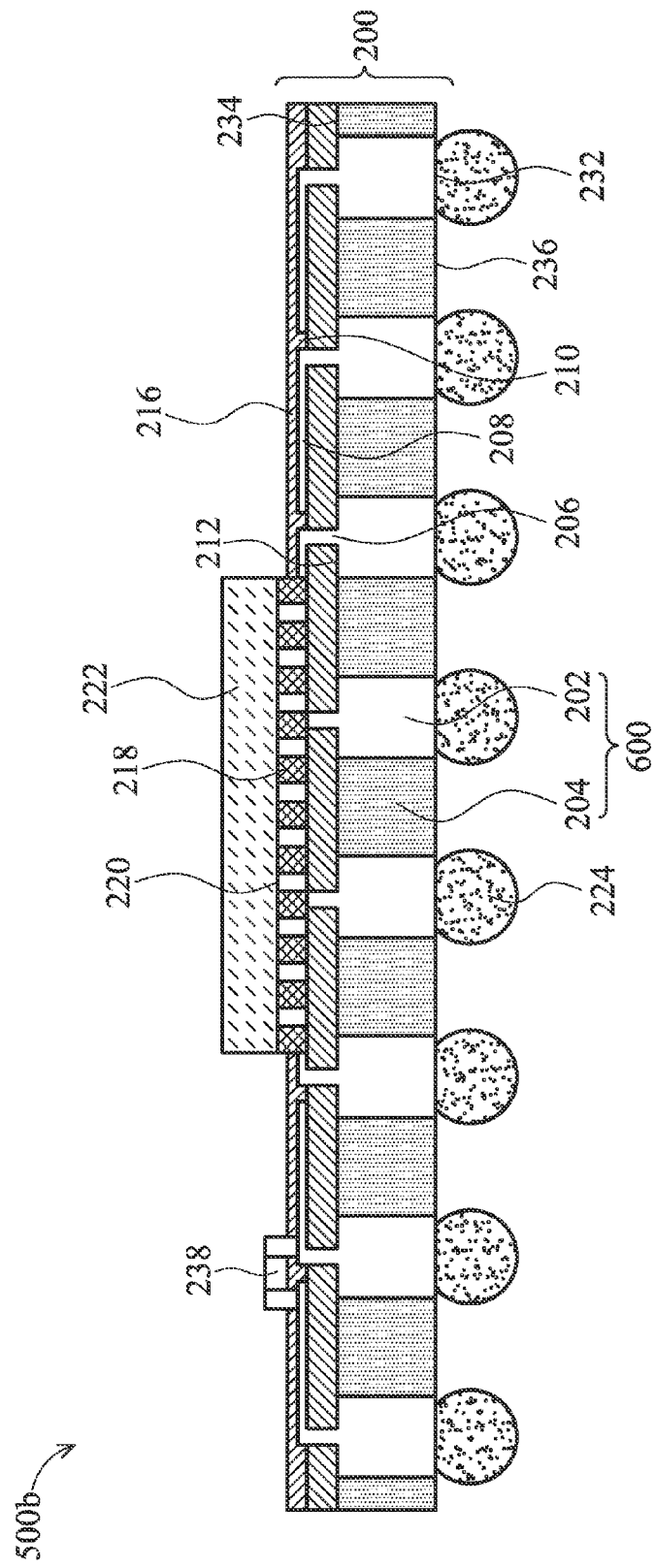
FIGS. 2 to 9 are cross sections of various exemplary embodiments of a molded interposer package of the invention.

FIGS. 2 to 9 are cross sections of various exemplary embodiments of molded interposer packages 500b to 500i of the invention. In another embodiment, the molded interposer package may carry at least one additional electronic component. As shown in FIG. 2, the molded interposer package 500b further comprises an electronic component separated from the chip 222, for example, a surface mount technology (SMT) device, disposed over a top surface 234 of the substrate 600. The discrete electronic component electrically connects to the metal studs 202 through the interconnect structure comprising redistribution layer patterns (including the first and second redistribution layer patterns 208, 214) and metal vias (including the first and second metal vias 206, 212).

Figure 3:
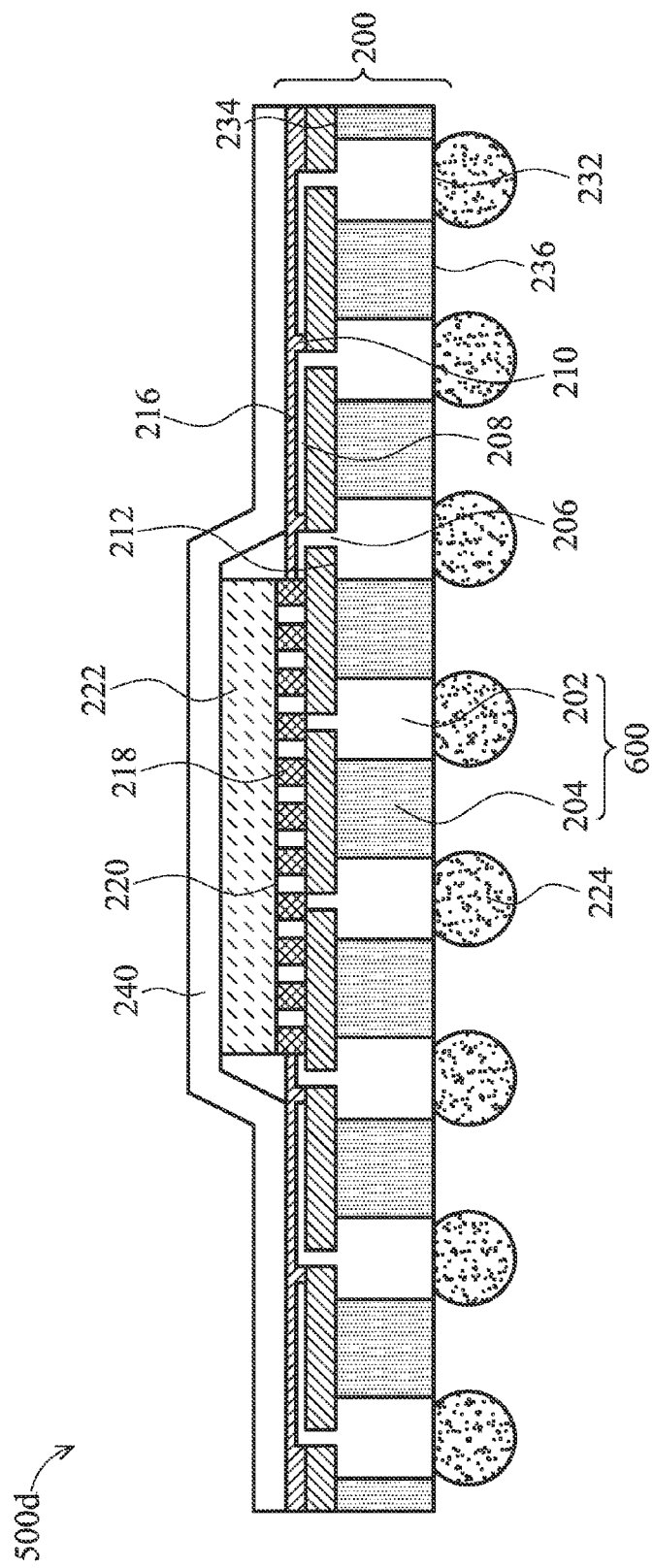

In another embodiment, the molded interposer package may add a heat spreader for further heat dissipation of the package structure. As shown in FIG. 3, the molded interposer package 500c further comprises a heat spreader 240 covering top surfaces of the chip 222 and the interconnect structure comprising redistribution layer patterns (including the first and second redistribution layer patterns 208, 214) and metal vias (including the first and second metal vias 206, 212). In one embodiment, the heat spreader 240 may comprise metal.

Figure 4:
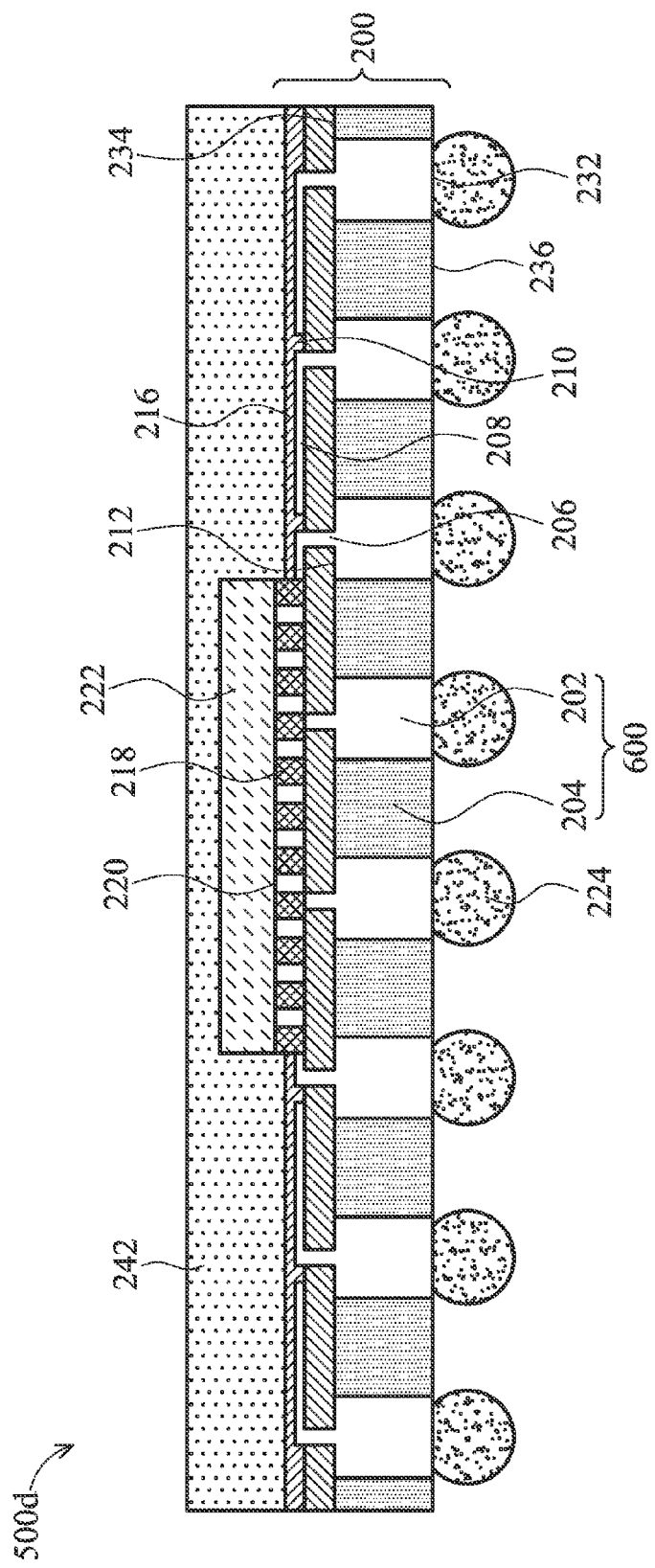

Alternatively, a mold cap is also used to be disposed on the molded interposer package for further package rigidity. As shown in FIG. 4, the molded interposer package 500d further comprises a mold cap 242 covering the chip and the interconnect structure comprising redistribution layer patterns (including the first and second redistribution layer patterns 208, 214) and metal vias (including the first and second metal vias 206, 212).

Figure 5:
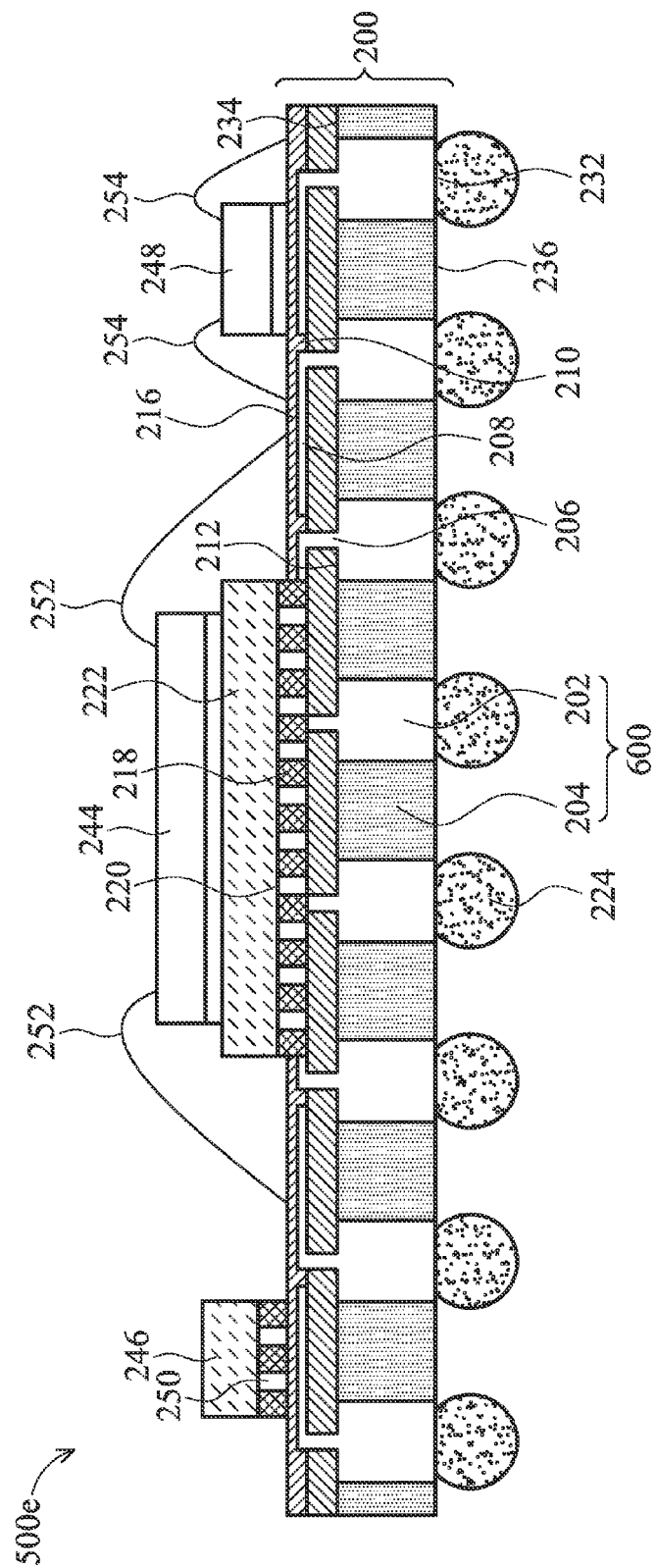

In another embodiment, the molded interposer package may compose a system-in-package (SIP). That is to say, the molded interposer package may carry several chips. As shown in FIG. 5, the molded interposer package 500e further comprises a chip 246 or 248 and is disposed beside the chip 222. Also, the molded interposer package 500e further comprises a chip 244 disposed directly on the chip 222. The chips of the molded interposer package may use a wire bonding or flip chip technology to connect to the interconnect structure comprising redistribution layer patterns (including the first and second redistribution layer patterns 208, 214) and metal vias (including the first and second metal vias 206, 212). As shown in FIG. 5, the chip 246 may connect to the interconnect structure through the conductive bumps 250 by the flip chip technology. Alternatively, the chip 244, which is disposed directly on the chip 222, and the chip 248, which is beside the chip 222, may connect to the interconnect structure through bonding wires 252 and 254, respectively.

Figure 6:
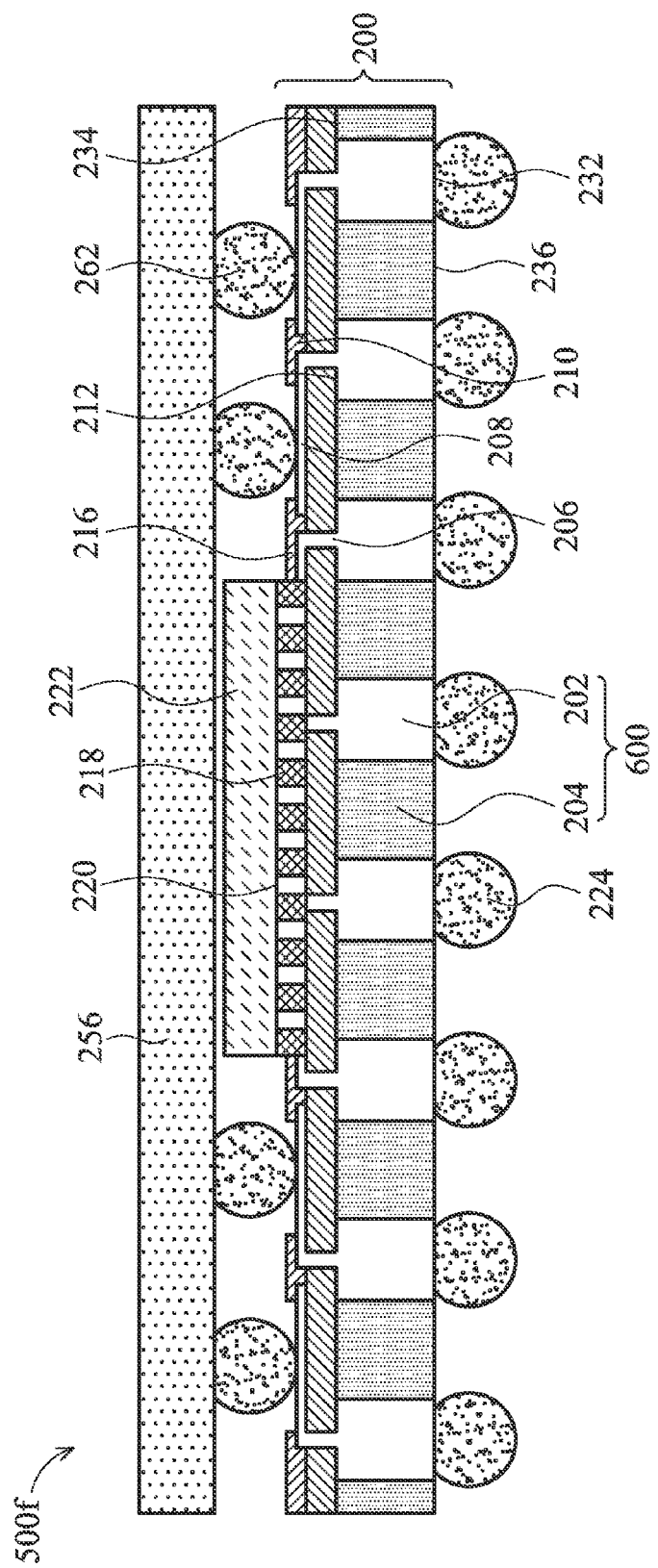
Figure 7:
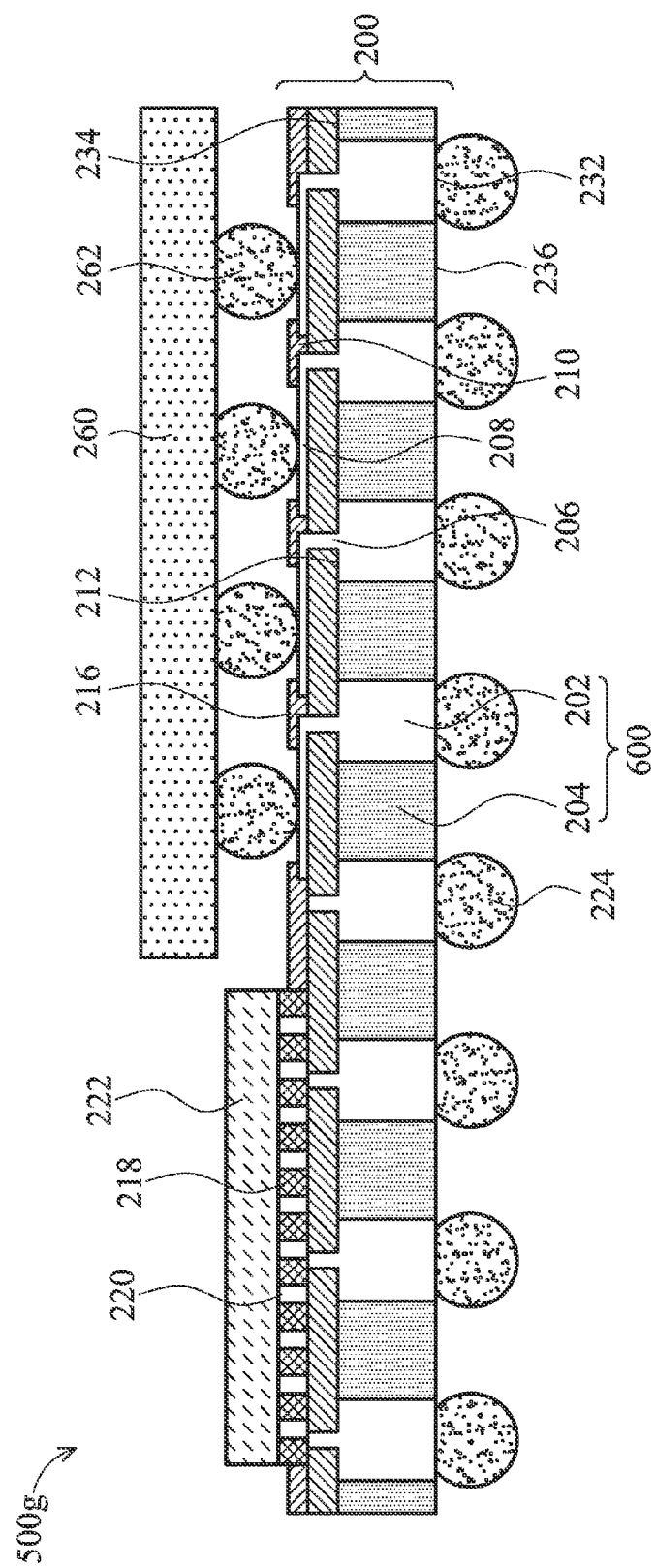

In still another embodiment, the molded interposer package may compose a package-on-package (POP) as shown in FIGS. 6 and 7. That is to say, the molded interposer package may allow another semiconductor device package to be disposed thereon. As shown in FIG. 6, the molded interposer package 500f further comprises a semiconductor device package 256 disposed on the MBI 200 and the chip 222. The semiconductor device package 256 is separated from the chip 222. Also, the semiconductor device package 256 may connect to the interconnect structure through the conductive bumps 258.

As shown in FIG. 7, alternatively, the molded interposer package 500g further comprises a semiconductor device package 260 disposed beside the chip 222, on the MBI 200. Also, the semiconductor device package 260 is separated from the chip 222. Further, the semiconductor device package 260 may connect to the interconnect structure through the conductive bumps 262.

Figure 8:
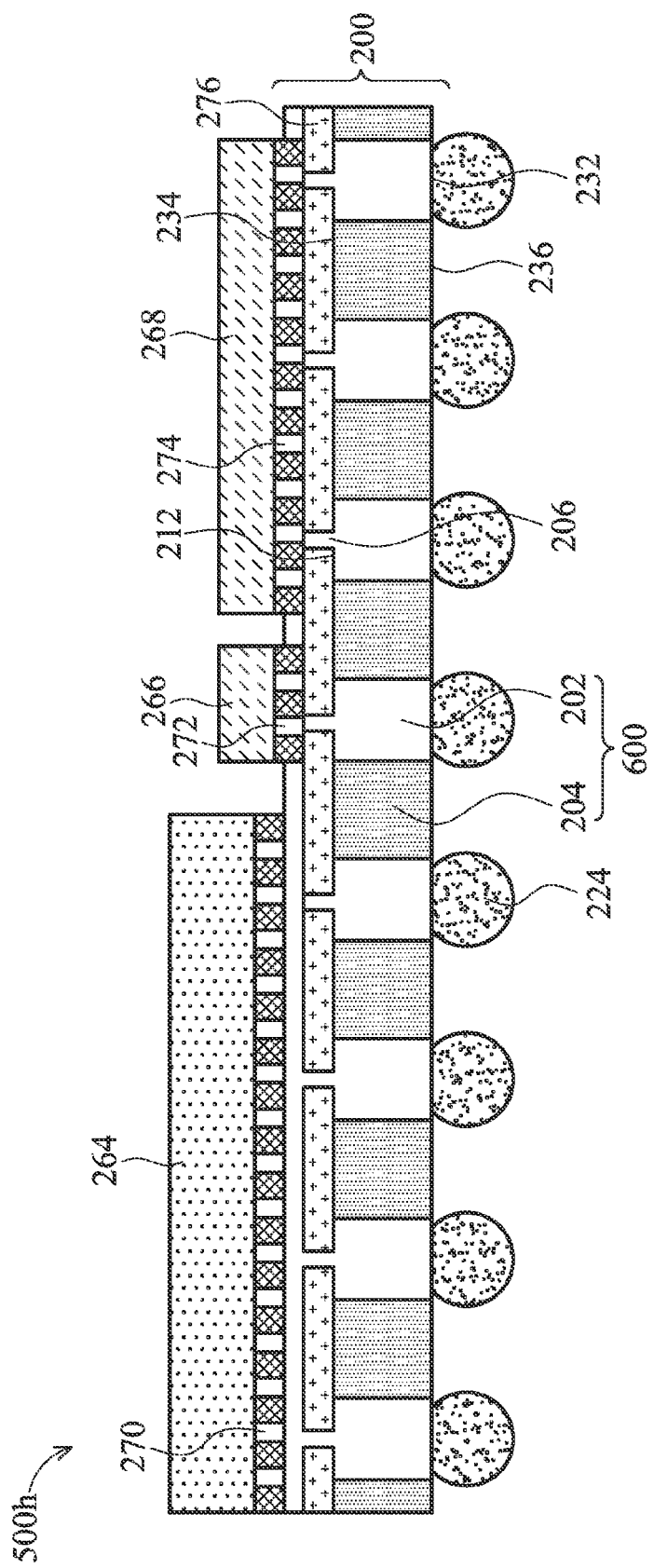

In yet another embodiment, the molded interposer package may comprise another silicon interposer disposed between the MBI and the chip for the flexible circuit design to achieve a multi-chip package. As shown in FIG. 8, the molded interposer package 500h further comprises a silicon interposer 276 disposed on the MBI 200. The silicon interposer 276 electrically connects to the MBI 200. Several chips 264, 266 and 268 separated from each other are allowed to be disposed on the silicon interposer 276. The chips on the silicon interposer 276 of the molded interposer package 500h may use SMT or flip chip technology to connect to the silicon interposer 276. For example, the chip 264 may use the flip chip technology to connect to the silicon interposer 276 through the conductive bumps 270. The chips 266 and 268 may use the SMT technology to connect to the silicon interposer 276 through the conductive bumps 272 and 274, respectively. It is noted that the molded interposer package 500h is fabricated without the interconnect structure comprising redistribution layer patterns (including the first and second redistribution layer patterns 208, 214) and metal vias (including the first and second metal vias 206, 212) as shown in FIG. 1. Also, the molded interposer package 500h may comprise the interconnect structure between the MBI 200 and the silicon interposer 276.

Figure 9:
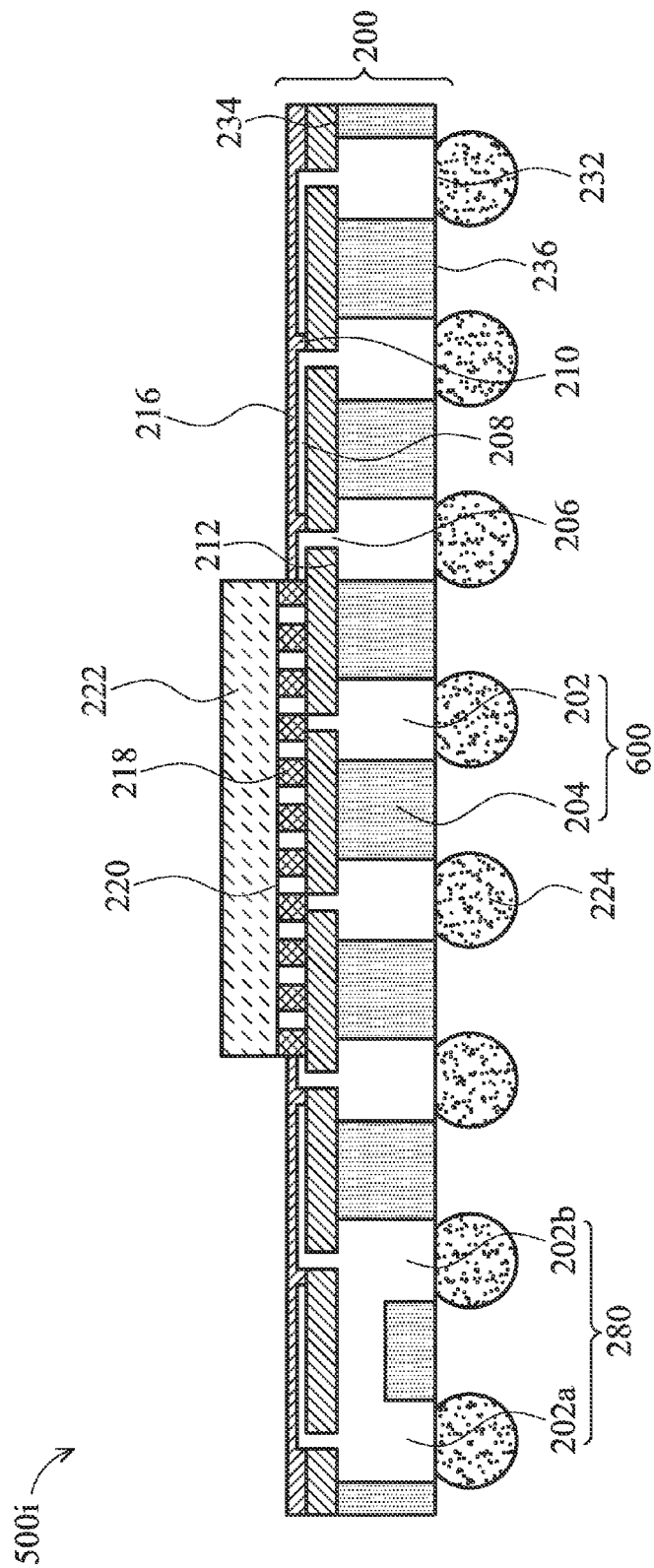

Alternatively, the metal studs for power transmission of the MBI of the molded interposer package may also serving as heat spreaders. As shown in FIG. 9, at least two of the metal studs 202a and 202b for power transmission of the molded interposer package 500i may be designed to be contacting to each other to form a metal island structure 280. Because the metal island structure 280 is formed of the metals such as copper, the metal island structure 280 has excellent heat dissipation ability. Therefore, the metal island structure 280 may not only serve as the power transmission, but also serving as an additional heat spreader of the molded interposer package 500i.

Figure 10:
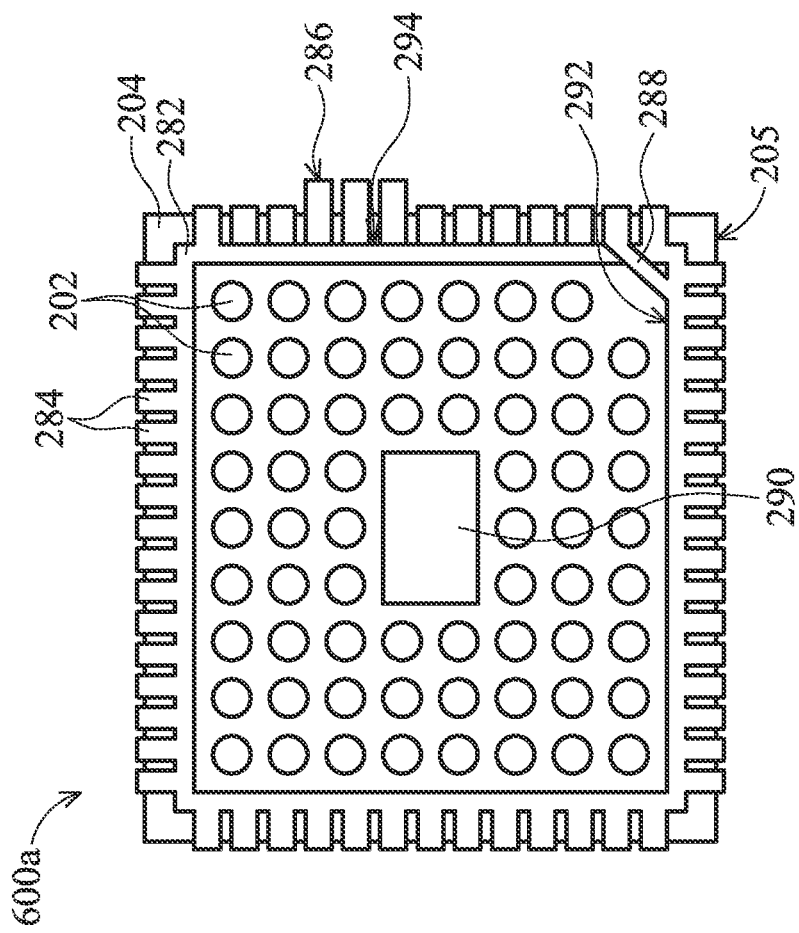
FIG. 10 is a top view showing an exemplary embodiment of a substrate of a molded interposer package of the invention.

FIG. 10 is a top view showing an exemplary embodiment of a substrate 600a of a molded interposer package of the invention showing another metal stud design. There are additional features which may be designed in the substrate during the metal stud process. The additional features have heat dissipation or rigidity enhancement functions. For package rigidity and flatness enhancement, the a substrate 600a further comprises a frame type metal stiffener 282 through the molding material 204, wherein an inner sidewall 292 of the frame type metal stiffener 282 surrounds the metal studs 202. In this embodiment, the frame type metal stiffener 282 may be parallel to a boundary 205 of the substrate 600a. For further heat dissipation of the package, a plurality of metal fins 284 may be disposed on an outer sidewall 294 of the frame type metal stiffener 282. As shown in FIG. 10, the metal fins 284 may be exposed to the boundary 205 of the substrate 600a. Alternatively, the metal fins 284 may extrude from a boundary 205 of the substrate 600a. Because the frame type metal stiffener 282 is arranged close to the boundary 205 of the substrate 600a, the frame type metal stiffener 282 and the metal fins 284 can collectively compose a three-dimensional (3D) heat spreader to dissipate heat to the outside rapidly. Moreover, a metal stiffener bar 288 may be formed through the molding material 204, connecting two adjacent sides of the frame type metal stiffener 282 for further package rigidity and flatness enhancement. Further, a power/ground pad 290 may be designed to be positioned in the center of the substrate 600a. The power/ground pad 290 provides a power/ground interconnection between the chip and the PCB. As shown in FIG. 10, an area of the power/ground pad 290 is designed to be larger than that of each of the metal studs 202 to provide good power performance and an additional heat spreader channel.

In one embodiment, the metal studs 202, the frame type metal stiffener 282, the metal fins 284, the metal stiffener bar 288 and the power/ground pad 290 are formed of the same material such as copper.

Figure 11A:
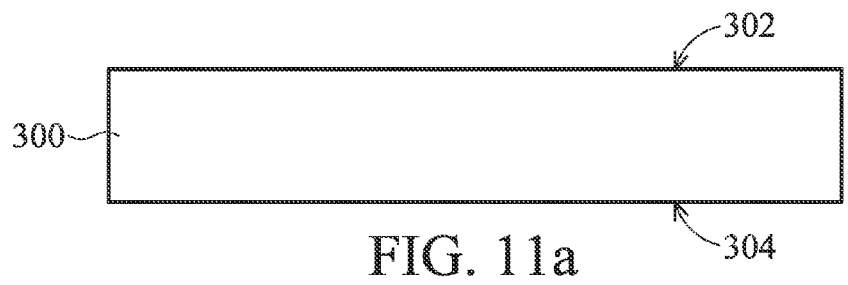
FIGS. 11a to 11i are cross sections showing one exemplary embodiment of a method for fabricating a molded interposer package of the invention.
Figure 11B:
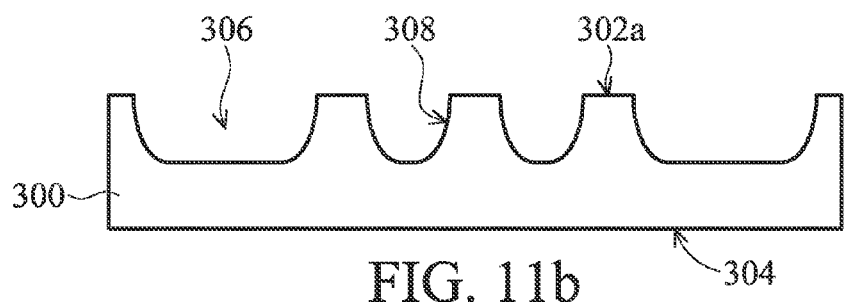

FIGS. 11a to 11i are cross sections showing one exemplary embodiment of a method for fabricating a molded interposer package of the invention. Also, the method for fabricating a molded interposer package as shown in FIGS. 11a to 11i may be named as a dual etch process. As shown in FIG. 11a, initially, a metal sheet 300 having a top surface 302 and a bottom surface 304 is provided. In one embodiment, the top surface 302 may serve as a chip-side surface of the molded buildup interposer of the molded interposer package. The bottom surface 304 may serve as a PCB-side surface of the molded buildup interposer of the molded interposer package.

In one embodiment, the metal sheet 300 has an all-in-one structure. The metal sheet 300 can be formed of copper. Next, please refer to FIG. 11*b*, wherein a photo lithography The and an anisotropic etching process is performed to remove a portion of the metal sheet 300 from the top surface 302 of the metal sheet 300, thereby forming a plurality of first recesses 306 in the metal sheet 300. It is noted that bottom surfaces of the first recesses 306 are within the metal sheet 300. After performing the anisotropic etching process, the upper portion of the metal sheet 300 turns into a plurality of mesas 308 between the first recesses 306. The mesas 308 having top surfaces 302*a* may serve as interconnect pads of the molded buildup interposer.

Figure 11C:
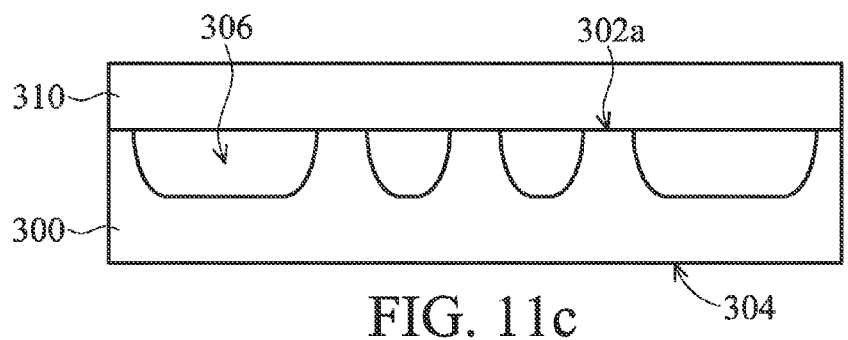
Figure 11D:
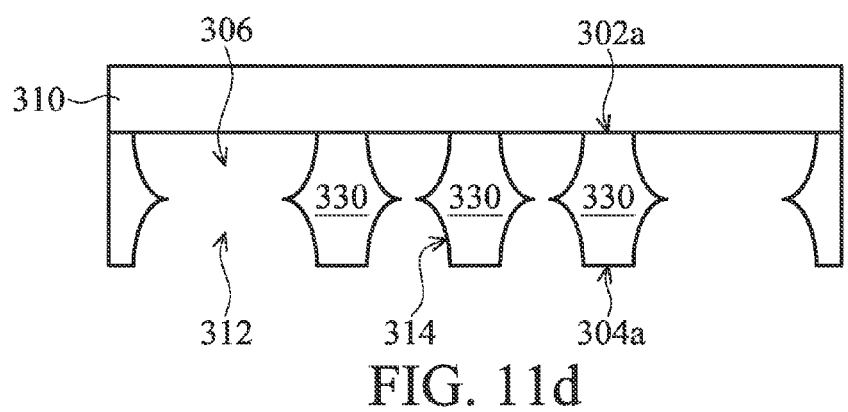

Next, please refer to FIG. 11*c*, wherein a carrier 310 is mounted on the top surface 302*a* of the mesas 308 of the metal sheet 300, leaving the bottom surface 304 exposed. Next, please refer to FIG. 11*d*, wherein a photo lithography and an anisotropic etching process is performed to remove a portion of the metal sheet 300 under the first recesses 306 from the bottom surface 304 of the metal sheet 300, thereby forming a plurality of second recesses 312 in the metal sheet 300, wherein the first recesses 306 and the second recesses 312 communicate with each other, respectively. After forming the second recesses 312, the lower portion of the metal sheet 300*a* is turned into a plurality of mesas 314 between the second recesses 312. The mesas 314 having the bottom surfaces 304*a* may serve as ball pads of the molded buildup interposer. After performing the processes, a plurality of discrete metal studs 330 each comprising the mesas 308 and 314 is formed. Also, the top surfaces 302*a* of the mesas 308 may serve as top surfaces 302*a* of the metal studs 330, and the top surfaces 304*a* of the mesas 314 may serve as bottom surfaces 302*a* of the metal studs 330.

It is noted that the metal studs 330 are fabricated by dual etching the metal sheet 300 having an all-in-one structure. Also, the metal studs 330 have an all-in-one structure with an improved rigidity over the conventional process. Therefore, the final molded interposer package may be fabricated with an increased size to achieve a goal of a full-size panel package.

Figure 11E:
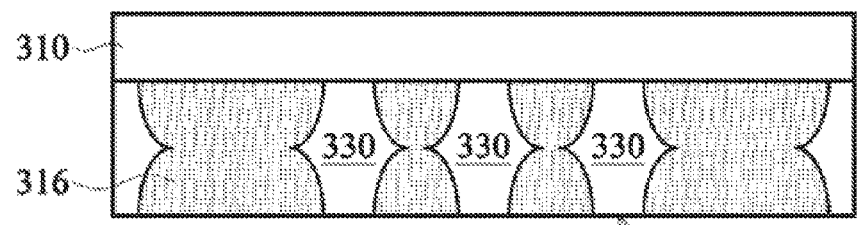
Figure 11F:
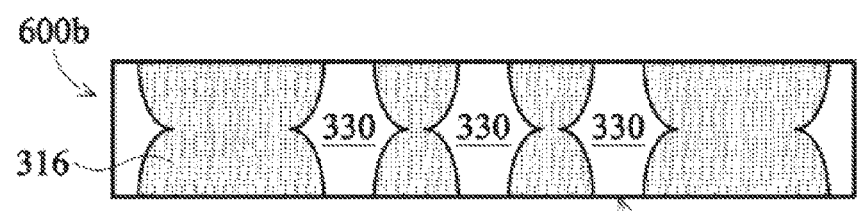

Next, please refer to FIG. 11*e*, wherein a molding material 316 fills the first recesses 306 and the second recesses 312 from the bottom surfaces 302*a* of the metal studs 330. The molding material 316 may be planarized by a planarization process such as a chemical mechanical (CMP) method, leaving the top surfaces 302*a* of the metal studs 330 exposed. In one embodiment, the molding material 316 comprises resin. The molding material 316 has an all-in-one structure. Next, please refer to FIG. 11*f*, wherein the carrier 310 is removed after filling the molding material 316. Therefore, a substrate 600*b* composed by the metal studs 330 and the molding material 316 is formed. Also, each of the metal studs 330 of the substrate 600*b* has a maximum width in the center from a cross section view (FIG. 11*f*).

It is noted that the molding material is formed encapsulating the metal studs to further enhance package rigidity. Therefore, a package mold cap covering the MBI and a chip in the conventional process can be eliminated. The fabrication cost of the package mold cap can be reduced while maintaining the package rigidity. Also, the substrate is formed by etching the etched metal sheet and then filling it with a molding material. Compared with the conventional interposer substrate, which is formed by a laminated BismaleimideI Triazine (BT), the fabrication cost for the interposer substrate can be reduced.

Figure 11G:
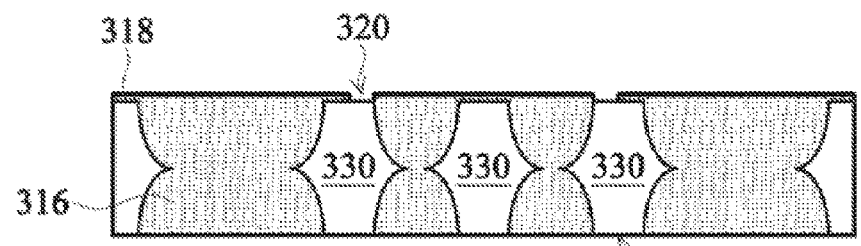

Next, please refer to FIG. 11*g*, wherein a passivation layer 318 is formed on the top surfaces 302*a* of the metal studs 330 by a deposition process, for example, a spin-coating method, a chemical vapor deposition (CVD) method, a physical vapor deposition (PVD) method or a plating method. Next, a patterning process such as a laser drilling method is performed to remove a portion of the passivation layer 318 to form a plurality of openings 320 therethrough. Portions of the top surfaces 302*a* of the metal studs 330 are exposed through the openings 320 of the passivation layer 318.

Figure 11H:
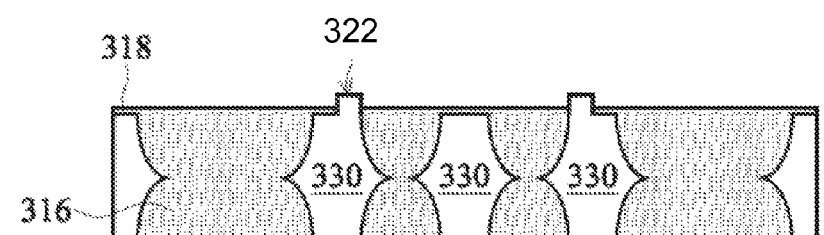

Next, please refer to FIG. 11*h*, wherein a plurality of first metal vias 322 is formed through the openings 320 by a deposition process, for example, a plating method. Alternatively, the first metal vias 322 may be formed by a deposition process, for example, a spin-coating method, a chemical vapor deposition (CVD) method, a physical vapor deposition (PVD) method, and a subsequent patterning process comprising a photolithography process and a subsequent anisotropic etching process. In other embodiments, several redistribution layer patterns, dielectric layers and metal vias at different levels may be formed on the first metal vias 322 to fabricate an interconnect structure on the top surfaces 302*a* of the metal studs 330 (also serving as ball pads of the MBI). For example, the first and second redistribution layer patterns 208, 214, the dielectric layer 210 and second metal vias 212 as shown in FIG. 1 may be formed on the first metal vias 322. Further, the first and second redistribution layer patterns 208, 214 may be formed by a deposition process and a patterning process. The dielectric layer 210 may be formed by a deposition process and a patterning process, which comprises a photolithography process and a subsequent anisotropic etching process, to form opening therethrough. Also, the second metal vias 212 may be formed in the openings by a deposition process.

It is noted that the interconnect structure can be formed only on one side (the ball pad side) of the MBI but not two sides of the MBI. Also, the metal layers (e.g. the redistribution layer patterns) of the interconnect structure may be added individually (e.g. one, two or three layers of the metal layers). Further, each layer of the interconnect structure be formed by suitable fabrication processes. Therefore, the cost of a laser drilling process used in the conventional technology can be limited. Compared with the conventional interconnect structure of the MBI, the fabrication cost for the layer processing of the interconnect structure can be reduced.

Figure 11I:
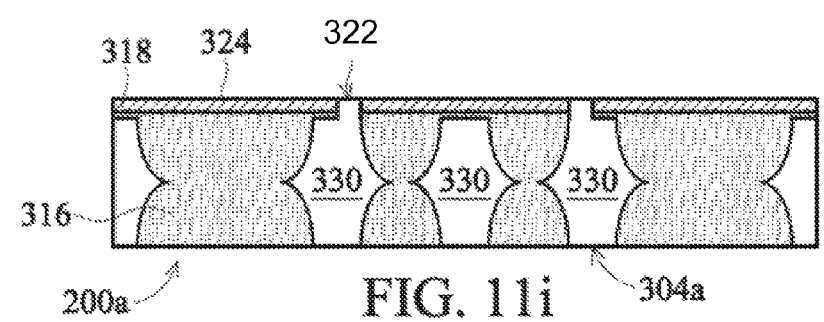

Next, please refer to FIG. 11*i*, wherein a solder mask layer pattern 324 is formed on the passivation layer 318, leaving the first metal vias 322 exposed. In other embodiments, the solder mask layer pattern 324 may be formed by electroplating with a patterned photoresist layer or by a screen printing process.

Next, a plurality of conductive bumps (such as the conductive bumps 220 as shown in FIG. 1) is formed through the solder mask layer pattern 324 to directly connect to the first metal vias 322. For example, the conductive bumps may be Cu pillars. Next, a chip (such as the chip 222 as shown in FIG. 1) may bond on the conductive bumps to connect to the first metal vias 322 by a bonding process. Therefore, the chip can bond on the first metal vias 223 or other redistribution layer patterns as shown in FIG. 1 without any solder ball by a bonding process such as a mass thermo-compression method. Compared with the conventional conductive bumps of the chip (solder balls), the fabrication cost for the conductive bumps can be reduced. Also, compared with the conventional chip attach process (mass reflow process), the fabrication cost for the chip attach process can be reduced.

Before bonding the chip on the first metal vias 322, an underfill material (such as the underfill material 218 as shown in FIG. 1) may be disposed on the solder mask layer pattern 324 where the chip is bonded thereto. In one embodiment, the underfill material may have a solid (film shape) or a liquid state. Compared with the conventional underfill material process, which is performed after bonding the chip on the substrate, the fabrication cost for the underfill material process can be reduced.

Next, a solder is formed on the bottom surfaces 302a of the metal studs 330 (i.e. ball pads) by electroplating with a patterned photoresist layer or by a screen printing process. Next, the patterned photoresist layer is removed and a solder reflow process is performed to form a plurality of solder balls (such as the solder balls 224 as shown in FIG. 1) on the bottom surface (i.e. the PCB-side surface) of the substrate 600b. After the aforementioned processes, one exemplary embodiment of a molded interposer package with the substrate 600b is completely formed.

It is noted that the PCB-side surface of the substrate 600a is not required to be covered by any solder mask layer. Compared with the conventional solder mask layer process, which is performed on both the chip-side and PCB-side of the substrate, the fabrication cost for the solder mask layer process can be reduced.

FIGS. 12a to 12f, 13a to 13h, 14a to 14g and 15a to 15h are cross sections showing various exemplary embodiments of a method for fabricating a molded interposer package of the invention.

Figure 12A:
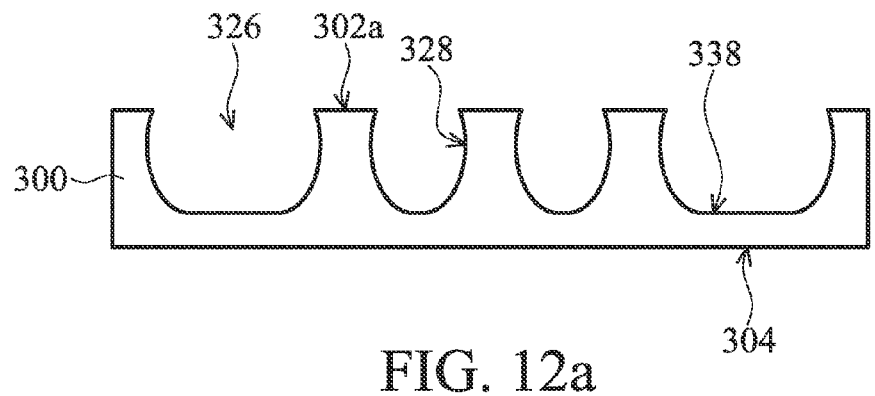
FIGS. 12a to 12f, 13a to 13g, 14a to 14g and 15a to 15g are cross sections showing various exemplary embodiments of a method for fabricating a molded interposer package of the invention.

FIGS. 12a to 12f are cross sections showing the steps for fabricating a molded interposer package according to another embodiment. Elements of the embodiments hereinafter, that are the same or similar as those previously described with reference to FIGS. 11a-11i, are not repeated for brevity. Also, the method for fabricating a molded interposer package as shown in FIGS. 12a to 12f may be named as a no-passivation process. As shown in FIG. 12a, after providing a metal sheet 300 as shown in FIG. 11a, a photolithography The and an anisotropic etching process is performed to remove a portion of the metal sheet 300 from the top surface 302 of the metal sheet 300, thereby forming a plurality of first recesses 326 in the metal sheet 300. It is noted that bottom surfaces 338 of the first recesses 326 are within the metal sheet 300. After performing the anisotropic etching process, the upper portion of the metal sheet 300a turns into a plurality of mesas 328 between the first recesses 326. The mesas 328 having top surfaces 302a may serve as interconnect pads of the molded buildup interposer.

Figure 12B:
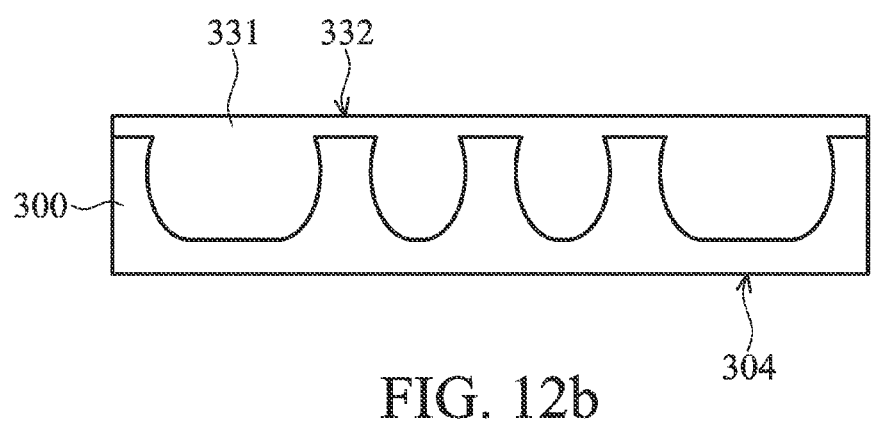

Next, please refer to FIG. 12b, wherein a molding material 331 fills the first recesses 326, covering the top surfaces 302a of the mesas 328 (interconnect pads). In one embodiment, the molding material 331 comprises resin. The molding material 331 has an all-in-one structure.

Figure 12C:
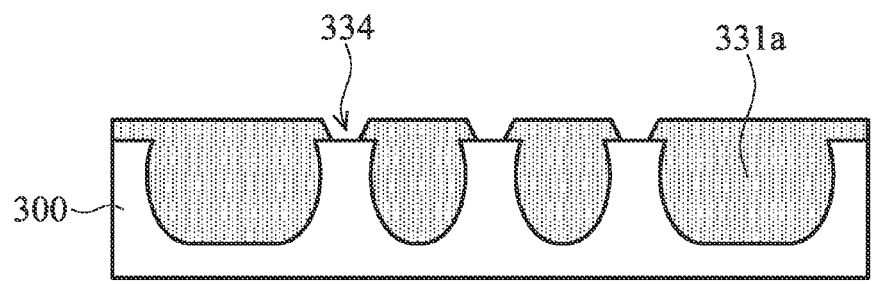

Next, please refer to FIG. 12c, wherein a patterning process comprising a photolithography and an anisotropic etching process is performed to remove a portion of the molding material 331 to from a plurality of via openings 334 in the molding material 331 and a plurality of the molding material patterns 331a, wherein the via openings expose the top surfaces 302a of the mesas 328 (interconnect pads).

Figure 12D:
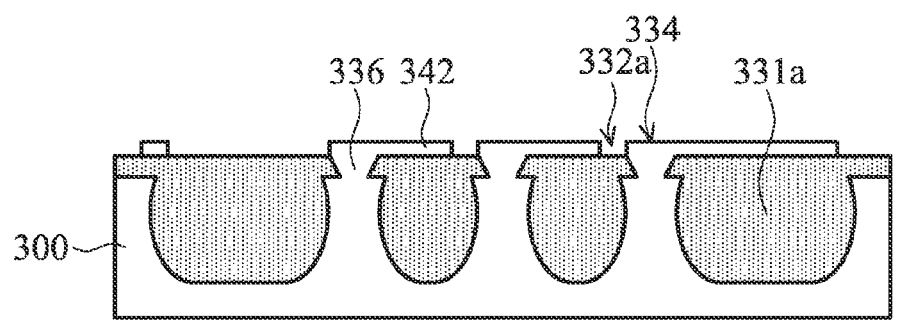

Next, please refer to FIG. 12d, wherein a plurality of first metal vias 336 in the via openings 334 and a plurality of first redistribution layer patterns 342 are simultaneously formed by a deposition process, for example, a plating method. Alternatively, the first metal vias 322 may be formed by a deposition process, for example, a spin-coating method, a chemical vapor deposition (CVD) method, a physical vapor deposition (PVD) method, and a subsequent patterning process comprising a photolithography process and a subsequent anisotropic etching process. The first redistribution layer patterns 342 are respectively on the first metal vias 336. Also, the redistribution layer patterns 342 extend to a portion of top surfaces 332a of the molding material patterns 331a In other embodiments, several redistribution layer patterns, dielectric layers and metal vias at different levels may be formed on the first metal vias 236 to fabricate an interconnect structure on the top surfaces 302a of the mesas 328 (also serving as ball pads of the MBI). For example, the first and second redistribution layer patterns 208, 214, the dielectric layer 210 and second metal vias 212 as shown in FIG. 1 may be formed on the first metal vias 322. Further, the first and second redistribution layer patterns 208, 214 may be formed by a deposition process and a patterning process. The dielectric layer 210 may be formed by a deposition process and a patterning process, which comprises a photolithography process and a subsequent anisotropic etching process, to form openings therethrough. Also, the second metal vias 212 may be formed in the openings by a deposition process.

Figure 12E:
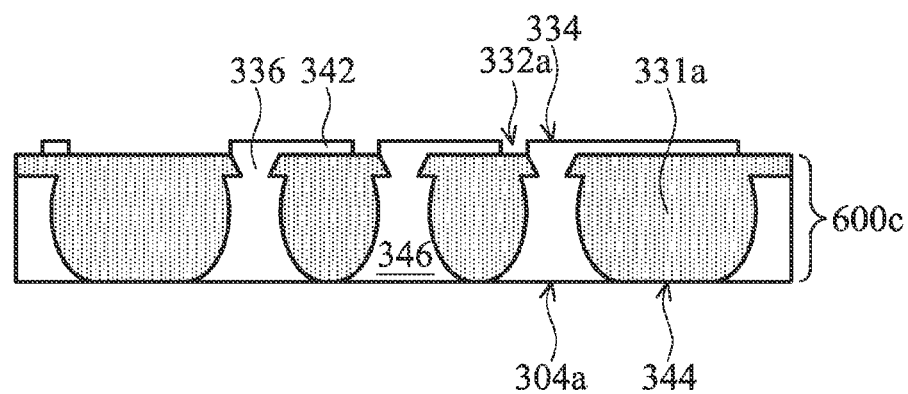

Next, please refer to FIG. 12e, wherein an anisotropic etching process to remove a portion of the metal sheet 300 from the bottom surface 304 of the metal sheet 300, so that bottoms 342 of the patterned molding material 331a is exposed, is shown. Also, the metal sheet 300 having the mesas 328 transforms into a plurality of discrete metal studs 346. Bottom surfaces 304a of the metal studs 346 may serve as ball pads of the molded buildup interposer. Therefore, a substrate 600c composed by the metal studs 346 and the patterned molding material 331a is formed. Also, each of the metal studs 346 of the substrate 600c has a taper profile from a cross section view (FIG. 12e).

Figure 12F:
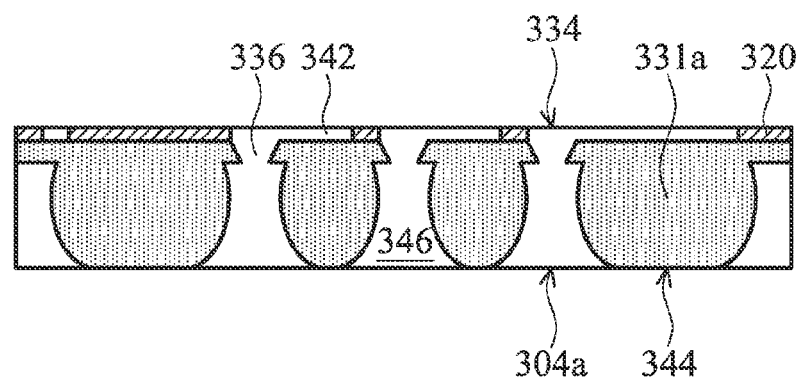

Next, please refer to FIG. 12f, wherein a solder mask layer pattern 340 is formed on the substrate 600c. The solder mask layer pattern 340 cover the patterned molding material 331a, leaving the first redistribution layer patterns 342 exposed. In other embodiments, the solder mask layer pattern 340 may be formed by electroplating with a patterned photoresist layer or by a screen printing process.

The subsequent underfill material process, chip bonding process and solder ball process may be the same or similar as those previously described with reference to FIGS. 11a-11i, are not repeated for brevity. After the aforementioned processes, one exemplary embodiment of a molded interposer package with the substrate 600c is completely formed.

Figure 13A:
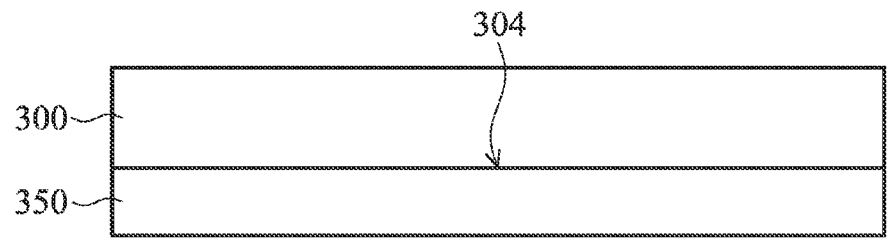

FIGS. 13a to 13g are cross sections showing the steps for fabricating a molded interposer package according to yet another embodiment. Elements of the embodiments hereinafter, that are the same or similar as those previously described with reference to FIGS. 11a-11i, 12a-12f, are not repeated for brevity. Also, the method for fabricating a molded interposer package as shown in FIGS. 13a to 13g may be named as a single etch process. As shown in FIG. 13a, after providing a metal sheet 300 as shown in FIG. 11a, a carrier 350 on the bottom surface 304 of the metal sheet 300.

Figure 13B:
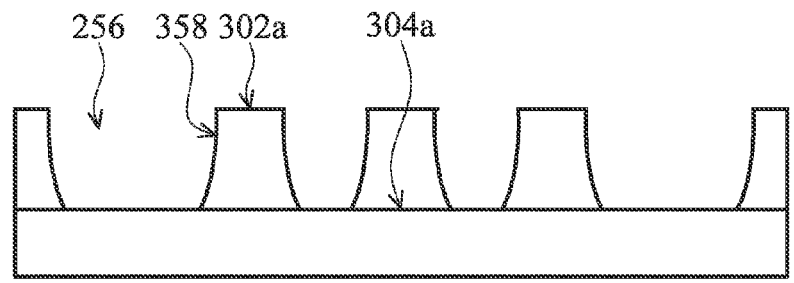

Next, please refer to FIG. 13b, wherein a photolithography The and an anisotropic etching process is performed to remove a portion of the metal sheet 300 from the top surface 302 of the metal sheet 300 until the carrier 350 is exposed, thereby forming a plurality of vias 256. After performing the anisotropic etching process, the metal sheet 300 turns into a plurality of the metal studs 358 separated from each other. Each of the metal studs 358 has a top surface 302a and bottom surface 304a. The top surfaces 302a of the metal studs 358 may serve as interconnect pads of the molded buildup interposer. Also, the surfaces 304a of the metal studs 358 may serve as ball pads of the molded buildup interposer.

Figure 13C:
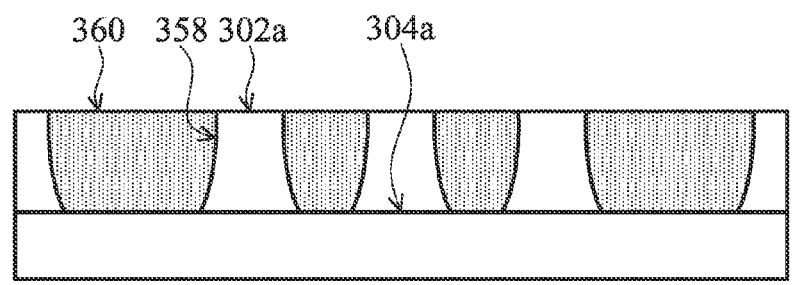
Figure 13D:
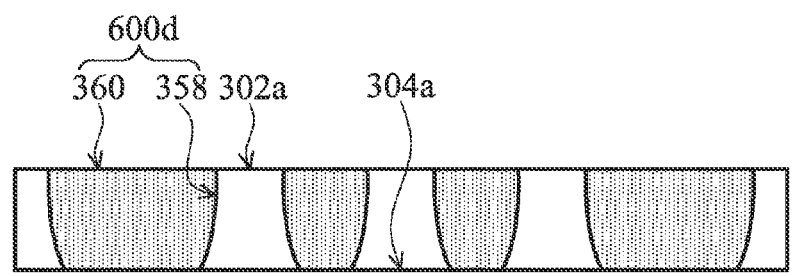

Next, please refer to FIG. 13c, wherein a molding material 360 fills the vias 256 as shown in FIG. 13b. Next, the molding material 356 may be planarized by a planarization process such as a chemical mechanical (CMP) method or an etching back process, leaving the top surfaces 302a of the metal studs 358 exposed. In one embodiment, the molding material 360 comprises resin. The molding material 360 has an all-in-one structure. Next, please refer to FIG. 13d, wherein the carrier 350 is removed after filling of the molding material 360. Therefore, a substrate 600d composed by the metal studs 358 and the molding material 360 is formed. Also, each of the metal studs 358 of the substrate 600d has a taper profile from a cross section view (FIG. 13d).

Figure 13E:
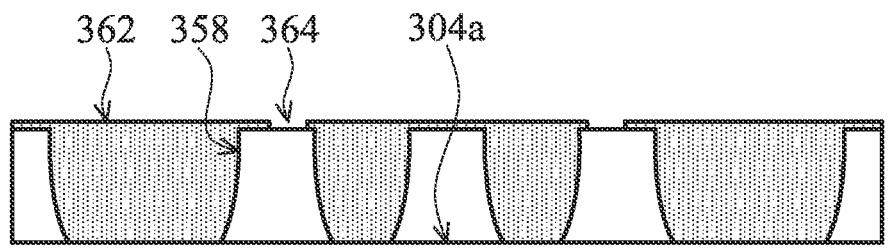

Next, please refer to FIG. 13e, wherein a passivation layer 362 is formed on the top surfaces 302a of the metal studs 358 by a deposition process, for example, a spin-coating method, a chemical vapor deposition (CVD) method, a physical vapor deposition (PVD) method or a plating method. Next, a patterning process such as a laser drilling method is performed to remove a portion of the passivation layer 362 to from a plurality of openings 364 therethrough. Portions of the top surfaces 302a of the metal studs 358 are exposed through the openings 364 of the passivation layer 362.

Figure 13F:
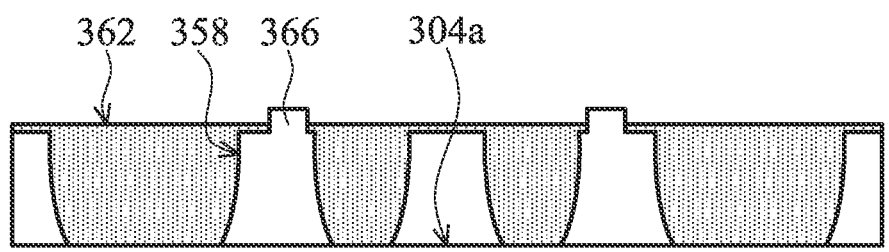

Next, please refer to FIG. 13f, wherein a plurality of first metal vias 366 is formed through the openings 364 by a deposition process, for example, a plating method. Alternatively, the first metal vias 366 may be formed by a deposition process, for example, a spin-coating method, a chemical vapor deposition (CVD) method, a physical vapor deposition (PVD) method, and a subsequent patterning process comprising a photolithography process and a subsequent anisotropic etching process. In other embodiments, several redistribution layer patterns, dielectric layers and metal vias at different levels may be formed on the first metal vias 366 to fabricate an interconnect structure on the top surfaces 302a of the metal studs 330 (also serving as ball pads of the MBI). For example, the first and second redistribution layer patterns 208, 214, the dielectric layer 210 and second metal vias 212 as shown in FIG. 1 may be formed on the first metal vias 322. Further, the first and second redistribution layer patterns 208, 214 may be formed by a deposition process and a patterning process. The dielectric layer 210 may be formed by a deposition process and a patterning process, which comprises a photolithography process and a subsequent anisotropic etching process, to form opening therethrough. Also, the second metal vias 212 may be formed in the openings by a deposition process.

Figure 13G:
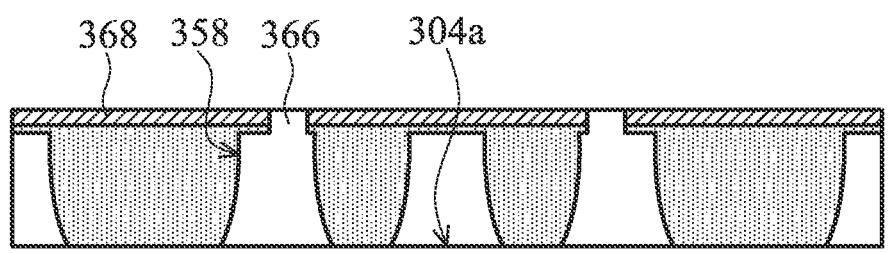

Next, please refer to FIG. 13g, wherein a solder mask layer pattern 368 is formed on the passivation layer 362, leaving the first metal vias 366 exposed. In other embodiments, the solder mask layer pattern 368 may be formed by electroplating with a patterned photoresist layer or by a screen printing process.

The subsequent underfill material process, chip bonding process and solder ball process may be the same or similar as those previously described with reference to FIGS. 11a-11i, are not repeated for brevity. After the aforementioned processes, one exemplary embodiment of a molded interposer package with the substrate 600d is completely formed.

Figure 14A:
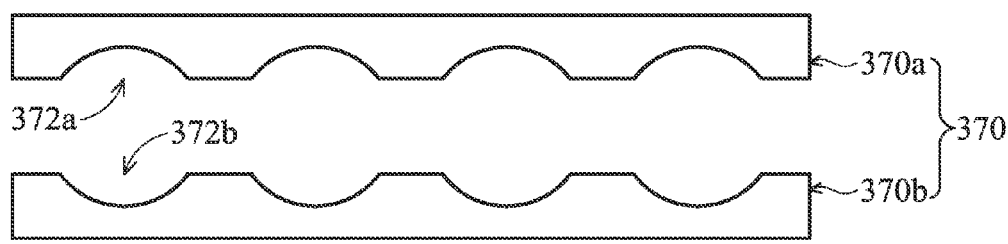

FIGS. 14a to 14g are cross sections showing the steps for fabricating a molded interposer package according to yet another embodiment. Elements of the embodiments hereinafter, that are the same or similar as those previously described with reference to FIGS. 11a-11i, 12a-12f, 13a-13g are not repeated for brevity. Also, the method for fabricating a molded interposer package as shown in FIGS. 14a to 14g may be named as a ball drop process. As shown in FIG. 14a, a mold chase 370 is provided. In this embodiment, the mold chase 370 may be composed by two mold plates 370a and 370b separated from each other. Each of the mold plates 370a and 370b has a plurality of dimple-shaped recesses 372a and 372b. Also, the dimple-shaped recesses 372a of the mold plate 370a respectively face to the dimple-shaped recesses 372b of the mold plate 370b.

Figure 14B:
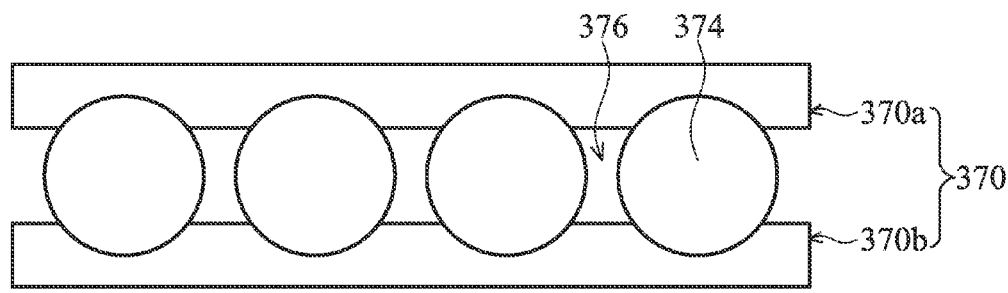

Next, please refer to FIG. 14b, wherein a plurality of the metal lumps 374 in the mold chase 370, between the mold plates 370a and 370b, is shown. As shown in FIG. 14b, upper portions and lower portions of the metal lumps 374 are respectively clamped by the dimple-shaped recesses 372a of the mold plate 370a and the dimple-shaped recesses 372b of the mold plate 370b. Therefore, the metal lumps 374 are separated from each other by a spacing 376. In this embodiment, the metal lumps 374 may have a ball-shaped all-in-one structure. For example, the metal lumps 374 may be copper balls.

Figure 14C:
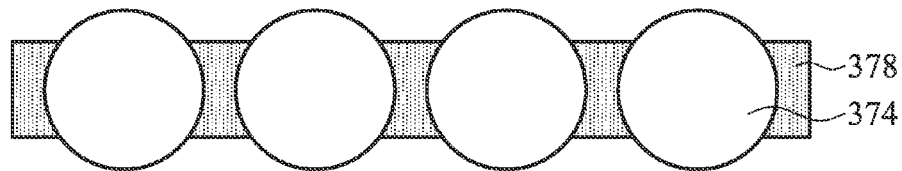

Next, please refer to FIG. 14c, wherein a molding material 378 fills into the spacing 376 of the mold chase 370 to encapsulate the metal lumps 374. It is noted that the upper portions and lower portions of the metal lumps 374 clamped by the dimple-shaped recesses 372a of the mold plate 370a and the dimple-shaped recesses 372b of the mold plate 370b are not covered by the molding material 378. In one embodiment, the molding material 378 comprises resin. The molding material 378 has an all-in-one structure. Next, the mold chase 370 is removed, leaving the upper portions and the lower portions of the metal lumps 374 exposed. In this embodiment, the exposed upper portions and lower portions of the metal lumps 374 may be crown shaped.

Figure 14D:
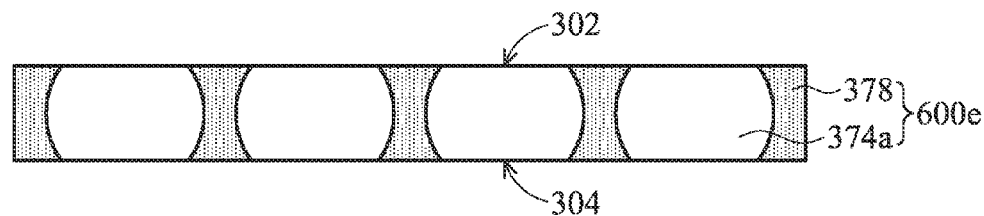

Next, please refer to FIG. 14d, wherein the metal lumps 374 may be planarized by a planarization process to remove the exposed upper portions and lower portions of the metal lumps 374 over a top surface and a bottom surface of the molding material 378. Therefore, a plurality of the metal lumps 374a is formed. In one embodiment, the planarization process may comprise a chemical mechanical (CMP) method. As shown in FIG. 14d, the top surfaces 302 of the metal lumps 374a are coplanar with a top surface of the molding material 378, and bottom surfaces 304 of the metal lumps 374a are coplanar with a bottom surface of the molding material 378. Therefore, a substrate 600e composed by the metal lumps 374a and the molding material 378 is formed. The substrate 600e has a planarized top surface and a planarized bottom surface. Also, each of the metal lumps 374a of the substrate 600e has a maximum width in the center from a cross section view (FIG. 14d).

Figure 14E:
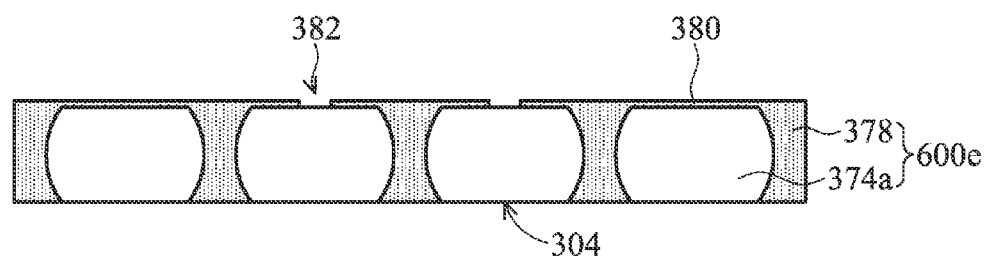

Next, please refer to FIG. 14e, wherein a passivation layer 380 is formed on the top surface of the substrate 600e by a deposition process, for example, a spin-coating method, a chemical vapor deposition (CVD) method, a physical vapor deposition (PVD) method or a plating method. Next, a patterning process such as a laser drilling method is performed to remove a portion of the passivation layer 380 to from a plurality of openings 382 therethrough. Portions of the top surfaces 302 of the metal lumps 374a of the substrate 600e are exposed through the openings 382 of the passivation layer 380.

Figure 14F:
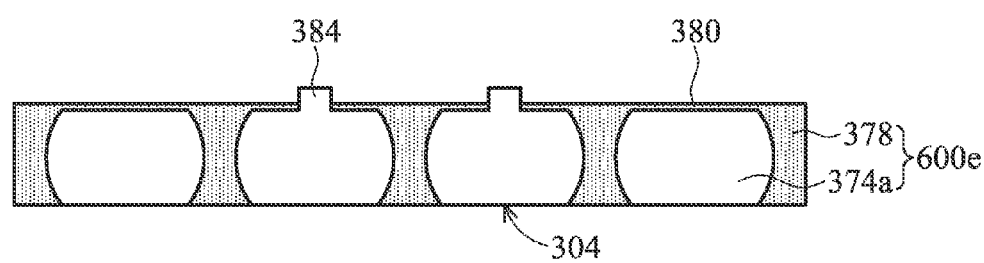

Next, please refer to FIG. 14f, wherein a plurality of first metal vias 384 is formed through the openings 382 by a deposition process, for example, a plating method. Alternatively, the first metal vias 384 may be formed by a deposition process, for example, a spin-coating method, a chemical vapor deposition (CVD) method, a physical vapor deposition (PVD) method, and a subsequent patterning process comprising a photolithography process and a subsequent anisotropic etching process. In other embodiments, several redistribution layer patterns, dielectric layers and metal vias at different levels may be formed on the first metal vias 384 to fabricate an interconnect structure on the top surface 302 of the substrate 600e (also serving as ball pads of the substrate 600e). For example, the first and second redistribution layer patterns 208, 214, the dielectric layer 210 and second metal vias 212 as shown in FIG. 1 may be formed on the first metal vias 322. Further, the first and second redistribution layer patterns 208, 214 may be formed by a deposition process and a patterning process. The dielectric layer 210 may be formed by a deposition process and a patterning process, which comprises a photolithography process and a subsequent anisotropic etching process, to form opening therethrough. Also, the second metal vias 212 may be formed in the openings by a deposition process.

Figure 14G:
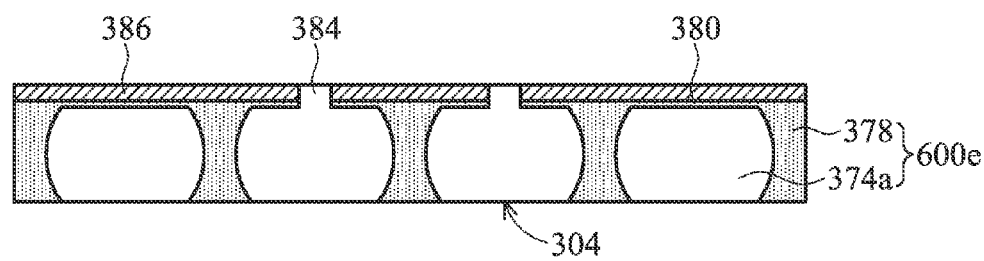

Next, please refer to FIG. 14g, wherein a solder mask layer pattern 386 is formed on the passivation layer 380, leaving the first metal vias 384 exposed. In other embodiments, the solder mask layer pattern 386 may be formed by electroplating with a patterned photoresist layer or by a screen printing process.

The subsequent underfill material process, chip bonding process and solder ball process may be the same or similar as those previously described with reference to FIGS. 11a-11i, are not repeated for brevity. After the aforementioned processes, one exemplary embodiment of a molded interposer package with the substrate 600e is completely formed.

Figure 15A:
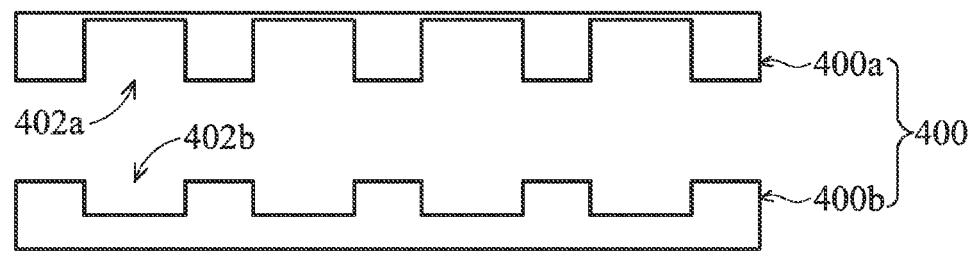

FIGS. 15a to 15g are cross sections showing the steps for fabricating a molded interposer package according to yet another embodiment. Elements of the embodiments hereinafter, that are the same or similar as those previously described with reference to FIGS. 11a-11i, 12a-12f, 13a-13g, 14a-14g are not repeated for brevity. Also, the method for fabricating a molded interposer package as shown in FIGS. 15a to 15g may be named as a stud insert process. As shown in FIG. 15a, a mold chase 400 is provided. In this embodiment, the mold chase 400 may composed by two mold plates 400a and 400b separated from each other. Each of the mold plates 400a and 400b has a plurality of slot-shaped recesses 402a and 402b. Also, the slot-shaped recesses 402a of the mold plate 400a respectively face to the slot-shaped recesses 402b of the mold plate 400b.

Figure 15B:
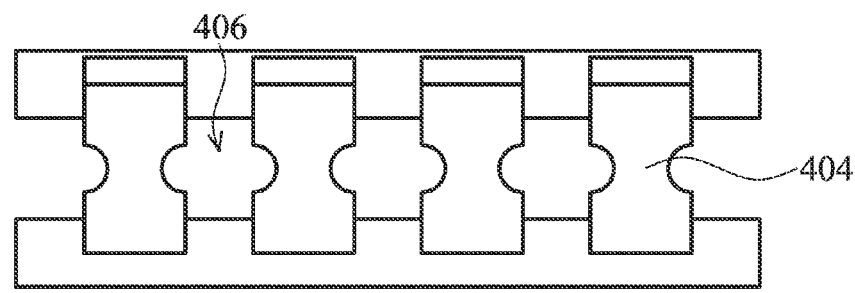

Next, please refer to FIG. 15b, wherein a plurality of the metal lumps 404 in the mold chase 400, between the mold plates 400a and 400b, is shown. As shown in FIG. 15b, upper portions and lower portions of the metal lumps 404 are respectively clamped by the slot-shaped recesses 402a of the mold plates 400a and the slot-shaped recesses 402b of the mold plates 400b. Therefore, the metal lumps 404 are separated from each other by a spacing 406. In this embodiment, the metal lumps 404 may have a stud-shaped all-in-one structure. For example, the metal lumps 404 may be copper studs.

Figure 15C:
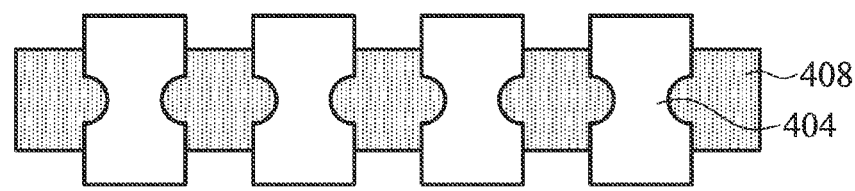

Next, please refer to FIG. 15c, wherein a molding material 408 fills into the spacing 406 of the mold chase 400 to encapsulate the metal lumps 404. It is noted that the upper portions and lower portions of the metal lumps 404 clamped by the slot-shaped recesses 402a of the mold plates 400a and the slot-shaped recesses 402b of the mold plates 400b are not covered by the molding material 408. In one embodiment, the molding material 408 comprises resin. The molding material 408 has an all-in-one structure. Next, the mold chase 400 is taken off, leaving the upper portions and the lower portions of the metal lumps 404 exposed. In this embodiment, the exposed upper portions and lower portions of the metal lumps 404 may be slotted shape.

Figure 15D:
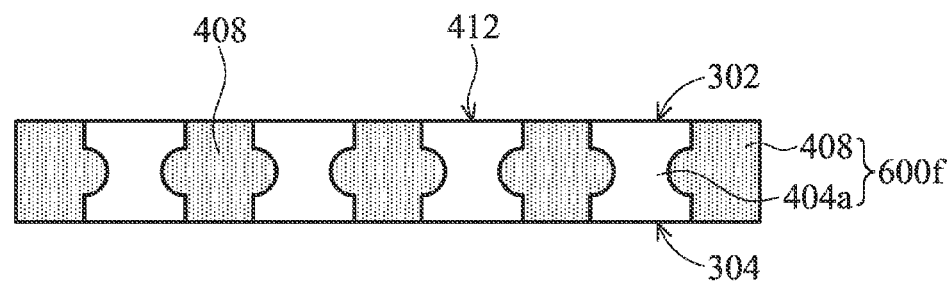

Next, please refer to FIG. 15d, wherein the metal lumps 404 may be planarized by a planarization process to remove the exposed upper portions and lower portions of the metal lumps 404 over a top surface and a bottom surface of the molding material 408. Therefore, a plurality of the metal lumps 404a is formed. In one embodiment, the planarization process may comprise a chemical mechanical (CMP) method. As shown in FIG. 15d, the top surfaces 402 of the metal lumps 404a are coplanar with a top surface of the molding material 408, and bottom surfaces 404 of the metal lumps 404a are coplanar with a bottom surface of the molding material 408. Therefore, a substrate 600f composed by the metal lumps 404a and the molding material 408 is formed. The substrate 600f has a planarized top surface and a planarized bottom surface. Also, each of the metal lumps 404a of the substrate 600f has a minimum width in the center from a cross section view (FIG. 15d).

Figure 15E:
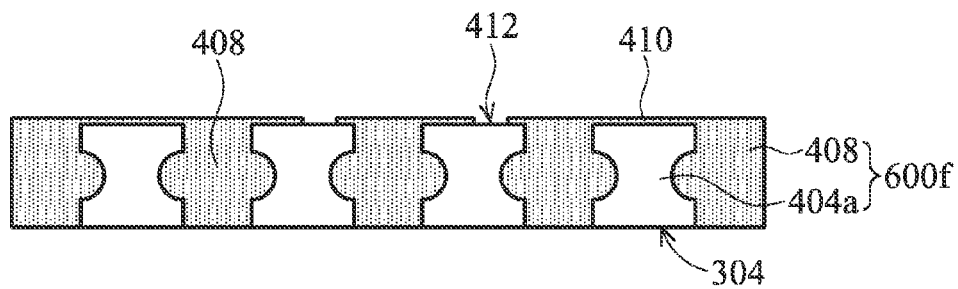

Next, please refer to FIG. 15e, wherein a passivation layer 410 is formed on the top surface of the substrate 600f by a deposition process, for example, a spin-coating method, a chemical vapor deposition (CVD) method, a physical vapor deposition (PVD) method or a plating method. Next, a patterning process such as a laser drilling method is performed to remove a portion of the passivation layer 410 to from a plurality of openings 412 therethrough. Portions of the top surfaces 302 of the metal lumps 404a of the substrate 600f are exposed through the openings 412 of the passivation layer 410.

Figure 15F:
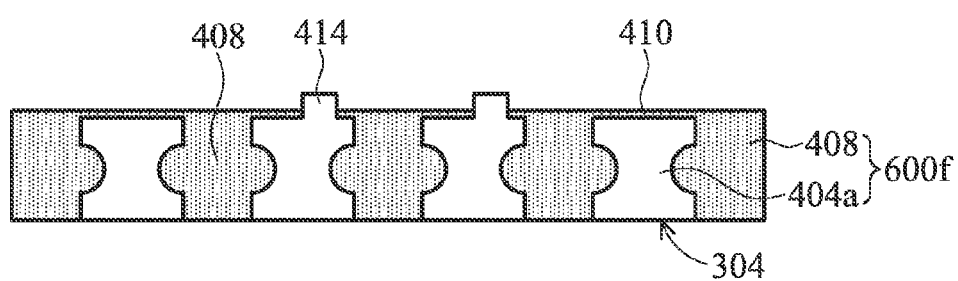

Next, please refer to FIG. 15f, wherein a plurality of first metal vias 414 is formed through the openings 412 by a deposition process, for example, a plating method. Alternatively, the first metal vias 414 may be formed by a deposition process, for example, a spin-coating method, a chemical vapor deposition (CVD) method, a physical vapor deposition (PVD) method, and a subsequent patterning process comprising a photolithography process and a subsequent anisotropic etching process. In other embodiments, several redistribution layer patterns, dielectric layers and metal vias at different levels may be formed on the first metal vias 414 to fabricate an interconnect structure on the top surface 402 of the substrate 600f (also serving as ball pads of the substrate 600f). For example, the first and second redistribution layer patterns 208, 214, the dielectric layer 210 and second metal vias 212 as shown in FIG. 1 may be formed on the first metal vias 322. Further, the first and second redistribution layer patterns 208, 214 may be formed by a deposition process and a patterning process. The dielectric layer 210 may be formed by a deposition process and a patterning process, which comprises a photolithography process and a subsequent anisotropic etching process, to form opening therethrough. Also, the second metal vias 212 may be formed in the openings by a deposition process.

Figure 15G:
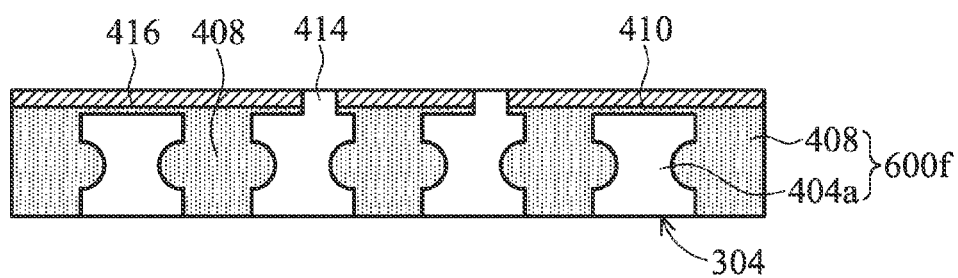

Next, please refer to FIG. 15g, wherein a solder mask layer pattern 416 is formed on the passivation layer 410, leaving the first metal vias 414 exposed. In other embodiments, the solder mask layer pattern 416 may be formed by electroplating with a patterned photoresist layer or by a screen printing process.

The subsequent underfill material process, chip bonding process and solder ball process may be the same or similar as those previously described with reference to FIGS. 11a-11i, are not repeated for brevity. After the aforementioned processes, one exemplary embodiment of a molded interposer package with the substrate 600f is completely formed.

Embodiments provide a molded interposer package and a method for fabricating the same. Embodiments of the molded interposer package can combine a leadframe, which is composed by metal studs, and redistribution layer (RDL) technology to reduce processes of laser drilling, patterning and plating. Also, embodiments of the method for fabricating a molded interposer package can utilize copper pillar technology with thermo-compression bonding and a pre-applied underfill material to achieve a chip bumping process and a chip attaching process with a reduced cost. The copper pillar technology can enhance package rigidity. Moreover, the molding material is integrated within the substrate of the molded interposer package. Therefore, the use of the transfer mold cap in the conventional technology can be eliminated to further reduce fabrication cost. Further, the fabrication process of the substrate of the molded interposer package can increase substrate size to achieve a full-sized panel. Therefore, the substrate fabrication process has better area utilization. Additionally, the substrate fabrication technology of the molded interposer package is available today from existing leadframe and mold compound suppliers. Therefore, embodiments of the molded interposer package can successfully integrated leadframe and mold compound suppliers.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A molded interposer package, comprising:
   a plurality of metal studs;
   a molding material encapsulating the metal studs leaving the bottom surfaces of the metal studs exposed, wherein there is no underfill encapsulation layer, made of a different material from the molding material, surrounding the molding material;
   a first chip disposed on the molding material, connecting to the top surfaces of the metal studs; and
   a plurality of solder balls connecting and contacting to the bottom surfaces of the metal studs.

2. The molded interposer package as claimed in claim 1, further comprising:
   a first redistribution layer pattern disposed between the molding material and the first chip, electrically connecting to both the metal studs and the first chip.

3. The molded interposer package as claimed in claims 1 and 2, further comprising:
   an interposer disposed on top surfaces of the metal studs.

4. The molded interposer package as claimed in claim 3, wherein the interposer electrically connects to both the metal studs and the first chip.

5. The molded interposer package as claimed in claim 1, further comprising:
   a solder mask layer disposed between the first redistribution layer pattern and the first chip; and
   a plurality of conductive bumps extending through the solder mask layer, connecting the first redistribution layer pattern to the first chip.

6. The molded interposer package as claimed in claim 5, wherein the conductive bumps comprise solder balls, metal pillars or combinations thereof.

7. The molded interposer package as claimed in claim 5, wherein the solder mask layer is a topmost layer on the molding material.

8. The molded interposer package as claimed in claim 5, further comprising an underfill material disposed between the solder mask layer pattern and the first chip.

9. The molded interposer package as claimed in claim 1, further comprising:
   a plurality of first metal vias connecting to both the top surfaces of the metal studs and the first redistribution layer pattern;
   a dielectric layer covering the first redistribution layer pattern;
   a plurality of second metal vias through the dielectric layer connecting to the first redistribution layer pattern; and
   a second redistribution layer pattern connecting to the second metal vias.

10. The molded interposer package as claimed in claim 9, further comprising:
    a passivation layer covering a top surface of the molding material, wherein the first metal vias extend through the passivation layer.

11. The molded interposer package as claimed in claim 1, wherein the top surfaces of the metal studs are lower or coplanar with a top surface of the molding material, and the bottom surfaces of the metal studs are above or coplanar with a bottom surface of the molding material.

12. The molded interposer package as claimed in claim 1, wherein a bottom surface of the molding material is not covered by any solder mask layer.

13. The molded interposer package as claimed in claim 1, further comprising at least one electronic component separated from the first chip disposed over a top surface of the molding material, connecting to the first redistribution layer pattern.

14. The molded interposer package as claimed in claim 1, further comprising a heat spreader covering the first chip and the first redistribution layer pattern.

15. The molded interposer package as claimed in claim 1, further comprising a mold cap covering the chip and the first redistribution layer pattern.

16. The molded interposer package as claimed in claim 1, further comprising:
    a second chip disposed beside the first chip or on the first chip.

17. The molded interposer package as claimed in claim 16, wherein the second chip connects to the first redistribution layer pattern through conductive bonding wires or conductive bumps.

18. The molded interposer package as claimed in claim 1, further comprising:
    a semiconductor device package disposed beside the first chip or on the first chip.

19. The molded interposer package as claimed in claim 18, wherein the semiconductor package connects to the first redistribution layer pattern through the conductive bumps.

20. The molded interposer package as claimed in claim 3, further comprising:
    a second chip disposed beside the first chip or on the first chip, wherein the second chip connects to the metal studs through the first interposer.

21. The molded interposer package as claimed in claim 1, wherein two of the metal studs contact to each other.

22. The molded interposer package as claimed in claim 1, further comprising:
    a frame type metal stiffener through the molding material, wherein an inner sidewall of the frame type metal stiffener surrounds the metal studs.

23. The molded interposer package as claimed in claim 22, further comprising:
    a plurality of metal fins disposed on an outer sidewall of the frame type metal stiffener, wherein the metal fins extrude from a boundary of the molding material.

24. The molded interposer package as claimed in claim 1, further comprising:
    a metal stiffener bar through the molding material, connecting to two adjacent sides of the frame type metal stiffener.

25. The molded interposer package as claimed in claim 24, wherein the metal studs, the frame type metal stiffener, the metal fins and the metal stiffener bar are formed of copper.

* * * * *